US011488050B2

(12) United States Patent
Shah et al.

(10) Patent No.: US 11,488,050 B2
(45) Date of Patent: Nov. 1, 2022

(54) SIGNAL-TO-NOISE BASED ERROR DETECTION

(71) Applicant: International Business Machines Corporation, Armonk, NY (US)

(72) Inventors: Priti Ashvin Shah, Basking Ridge, NJ (US); Jonathan Allen Wildstrom, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 262 days.

(21) Appl. No.: 16/897,958

(22) Filed: Jun. 10, 2020

(65) Prior Publication Data

US 2021/0390440 A1    Dec. 16, 2021

(51) Int. Cl.
| | |
|---|---|
| *H03M 1/12* | (2006.01) |
| *H03M 1/66* | (2006.01) |
| *G06N 10/00* | (2022.01) |
| *H03M 1/82* | (2006.01) |
| *H03M 1/10* | (2006.01) |

(52) U.S. Cl.
CPC .......... *G06N 10/00* (2019.01); *H03M 1/1071* (2013.01); *H03M 1/124* (2013.01); *H03M 1/82* (2013.01)

(58) Field of Classification Search
CPC ........ G06N 10/00; G06N 10/70; G06N 10/40; H03M 1/1071; H03M 1/124; H03M 1/82; G01R 29/26
USPC ................................................. 341/155, 144
See application file for complete search history.

(56) References Cited

U.S. PATENT DOCUMENTS

| | | | |
|---|---|---|---|
| 10,275,717 B2 | 4/2019 | Babbush et al. | |
| 10,402,743 B1 | 9/2019 | Rigetti et al. | |
| 10,552,755 B2 | 2/2020 | Lanting | |
| 2010/0079170 A1* | 4/2010 | Mattes | G01R 19/2506 327/1 |

(Continued)

FOREIGN PATENT DOCUMENTS

WO       2004086295 A1    10/2004

OTHER PUBLICATIONS

Doerry, et al. "Discriminating spurious signals in radar data using multiple channels." https://www.osti.gov/biblio/1458331. 2017. 9 pages.

(Continued)

*Primary Examiner* — Jean B Jeanglaude
(74) *Attorney, Agent, or Firm* — Amin, Turocy & Watson, LLP

(57) ABSTRACT

Techniques regarding error detection in one or more generated signals based on one or more signal-to-noise ratios are provided. For example, one or more embodiments described herein can include a system, which can include a memory that can store computer executable components. The system can also include a processor, operably coupled to the memory, and that can execute the computer executable components stored in the memory. The computer executable components can include a signal analysis component that can determine a signal-to-noise ratio associated with a generated signal, wherein the signal-to-noise ratio incorporates a signal value based on a reference signal and a noise value based on a difference between the reference signal and an acquired signal.

20 Claims, 17 Drawing Sheets

(56) References Cited

U.S. PATENT DOCUMENTS

| | | | |
|---|---|---|---|
| 2014/0140440 A1 | 5/2014 | Sun et al. | |
| 2017/0286858 A1* | 10/2017 | La Cour | G06F 7/523 |
| 2017/0351967 A1 | 12/2017 | Babbush et al. | |
| 2019/0122133 A1 | 4/2019 | Zohren et al. | |
| 2019/0392341 A1 | 12/2019 | Leipold et al. | |
| 2019/0392342 A1 | 12/2019 | Leipold et al. | |
| 2020/0003925 A1 | 1/2020 | Leipold et al. | |
| 2020/0034736 A1 | 1/2020 | Mueller et al. | |

OTHER PUBLICATIONS

Whaley. "Quantum Control of Qubits and Quantum Systems." https://www.calyptus.caltech.edu/qis2009/documents/whaleyQIS0409pdf.pdf. Last Accessed Apr. 3, 2020. 25 pages.

Sauer. "LMX2581: Improvement of SNR." Texas Instruments, http://e2e.ti.com/support/clock-and-timing/f/48/t/619900?LMX2581-Improvement-of-SNR. Last Accessed Apr. 3, 2020.

Xie "Tips and Tricks for Addressing Fixed-Frequency Spurs in ADC Signal Chains." Electronic Design, https://vww.electronicdesign.com/technologies/analog/article/21805167/tips-and-tricks-for-addressing-fixedfrequency-spurs-in-adc-signal-chains; Last Accessed Apr. 28, 2020. 6 pages.

"Numpy.Correlate" Numpy, https://numpy.org/doc/1.18/reference/generated/numpy.correlate.html, Last Accessed Jun. 5, 2020. 2 pages.

"Numpy/Numpy" Github, https://github.com/numpy/numpy/blob/v1.18.4/numpy/core/numeric.py#L647-L713, Last Accessed Jun. 5, 2020, 54 pages.

"Numpy.convolve" NumPy, https://numpy.org/doc/1.18/reference/generated/numpy.convolve.html#numpy.convolve, Last Accessed Jun. 5, 2020, 2 pages.

Mell, Peter, et al. "The NIST Definition of Cloud Computing." National Institute of Standards and Technology. Sep. 2011. 7 pages.

* cited by examiner

SIGNAL-TO-NOISE BASED ERROR DETECTION

BACKGROUND

The subject disclosure relates to detecting one or more errors in a generated signal based on a determined signal-to-noise ratio ("SNR"), and more specifically, to evaluating a SNR associated with a generated signal in comparison to one or more reference SNR values.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can evaluate the quality of one or more electronic signals based on SNR values are described.

According to an embodiment, a system is provided. The system can comprise a memory that can store computer executable components. The system can also comprise a processor, operably coupled to the memory, that can execute the computer executable components stored in the memory. The computer executable components can comprise a signal analysis component that determines a signal-to-noise ratio associated with a generated signal Further, the signal-to-noise ratio can incorporate a signal value based on a reference signal and a noise value based on a difference between the reference signal and an acquired signal.

According to an embodiment, a computer-implemented method is provided. The computer-implemented method can comprise determining, by a system operatively coupled to a processor, a signal-to-noise ratio associated with a generated signal. Further, the signal-to-noise ratio incorporates a signal value based on a reference signal and a noise value based on a difference between the reference signal and an acquired signal.

According to an embodiment, a computer program product for detecting errors in a generated signal is provided. The computer program product can comprise a computer readable storage medium having program instructions embodied therewith. The program instructions can be executable by a processor to cause the processor to determine, by the processor, a signal-to-noise ratio associated with the generated signal. Further, the signal-to-noise ratio can incorporate a signal value based on a reference signal and a noise value based on a difference between the reference signal and an acquired signal.

DETAILED DESCRIPTION

Figure 1:
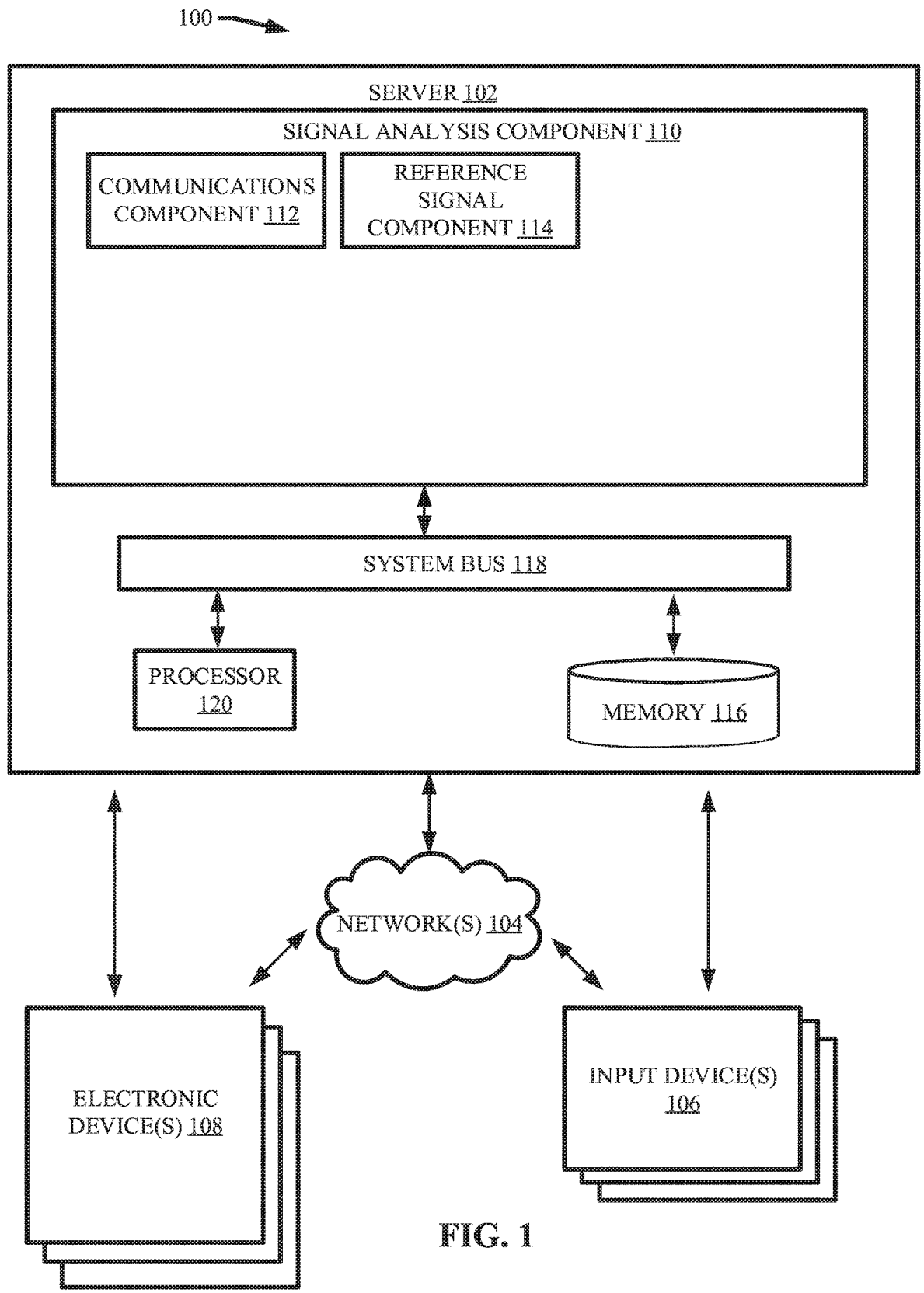
FIG. 1 illustrates a block diagram of an example, non-limiting system that can detect errors in a signal based on one or more SNR measurements in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Electrical signals used to control one or more electronic devices can comprise spurious data. For example, errors comprised within the signals can include spurs, internal timing instability, phase slips, a combination thereof, and/or the like. In many instances, these electrical signals are used to control one or more processing units, such as one or more qubits of a quantum computer. However, spurious data within the signals can negatively affect the intended control operations. For instance, spurious data within one or more qubit control signals can result in an unexpected loss of fidelity of one or more qubits.

Various embodiments of the present invention can be directed to computer processing systems, computer-implemented methods, apparatus and/or computer program products that facilitate the efficient, effective, and autonomous (e.g., without direct human guidance) detection of errors within one or more generated signals. For example, one or more embodiments described herein can detect spurious data within a generated signal by determining one or more SNRs as a function of two signals. For instance, a control signal can be computed as the signal part of the SNR and the noise part of the SNR can be computed as the difference between an acquired signal and the control signal. Thereby, acquired signals can be analyzed based on a SNR measurement with respect to one or more reference SNRs known to be acceptable for the given context. Further, the acquired signals can be analyzed prior to controlling one or more processing units, such that errors in the signals can be detected before undesirable effects are realized in the control operations.

The computer processing systems, computer-implemented methods, apparatus and/or computer program products employ hardware and/or software to solve problems that are highly technical in nature (e.g., detecting errors in one or more generated electrical signals), that are not abstract and cannot be performed as a set of mental acts by a human. For example, an individual, or a plurality of individuals, cannot readily detect spurious data within one or more generated electrical signals in preparation for one or more control operations directed to a processing unit in accordance with the various embodiments described herein.

Also, one or more embodiments described herein can constitute a technical improvement over conventional error detection technologies by implementing error detection via one or more software components as opposed to conventional hardware. Additionally, various embodiments described herein can demonstrate a technical improvement over conventional error detection technologies by detecting erroneous data beyond spurs, such as internal delays, amplitude variability, phase changes, a combination thereof, and/or the like. For example, various embodiments described herein can compute one or more SNR measurements as a function of multiple signals to facilitate determinations whether the quality of an acquired signal is within a defined standard.

Further, one or more embodiments described herein can have a practical application by enabling one or more quality control procedures to test the quality of control signals prior to employment. For instance, various embodiments described herein can evaluate the quality of one or more qubit control signals prior to employment on one or more qubits so as to avoid losses of fidelity. Additionally, various embodiments described herein can be employed when developing hardware as a test to compare two solutions of potential hardware implementations. Further, one or more embodiments described herein can be employed when manufacturing electronic hardware, as various features can detect multiple types of errors within a single test. Moreover, various embodiments described herein can be employed when hardware is deployed and in use, wherein the operating system can employ the system described herein to test the status of the associate electronic hardware. One or more embodiments described herein can control various components of a quantum computer to analyze one or more qubit control signals. Thereby, the one or more embodiments, can detect errors in the qubit control signals prior to one or more qubit control operations to avoid loss of fidelity amongst a qubit array.

FIG. 1 illustrates a block diagram of an example, non-limiting system 100 that can detect one or more errors in a generated electrical signal. Repetitive description of like elements employed in other embodiments described herein is omitted for sake of brevity. Aspects of systems (e.g., system 100 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines (e.g., computers, computing devices, virtual machines, etc. can cause the machines to perform the operations described).

As shown in FIG. 1, the system 100 can comprise one or more servers 102, one or more networks 104, input devices 106, and/or electronic devices 108. The server 102 can comprise signal analysis component 110. The signal analysis component 110 can further comprise communications component 112 and/or reference signal component 114. Also, the server 102 can comprise or otherwise be associated with at least one memory 116. The server 102 can further comprise a system bus 118 that can couple to various components such as, but not limited to, the signal analysis component 110 and associated components, memory 116 and/or a processor 120. While a server 102 is illustrated in FIG. 1, in other embodiments, multiple devices of various types can be associated with or comprise the features shown in FIG. 1. Further, the server 102 can communicate with one or more cloud computing environments.

The one or more networks 104 can comprise wired and wireless networks, including, but not limited to, a cellular network, a wide area network (WAN) (e.g., the Internet) or a local area network (LAN). For example, the server 102 can communicate with the one or more input devices 106 and/or electronic devices 108 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the signal analysis component 110 can be provided on the one or more servers 102, it should be appreciated that the architecture of system 100 is not so limited. For example, the signal analysis component 110, or one or more components of signal analysis component 110, can be located at another computer device, such as another server device, a client device, etc.

The one or more input devices 106 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. The one or more input devices 106 can be employed to enter one or more data settings into the system 100, thereby sharing (e.g., via a direct connection and/or via the one or more networks 104) said data with the server 102. For example, the one or more input devices 106 can send data to the communications component 112 (e.g., via a direct connection and/or via the one or more networks 104). Additionally, the one or more input devices 106 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

In various embodiments, the one or more input devices 106 and/or the one or more networks 104 can be employed to input one or more settings and/or commands into the system 100. For example, in the various embodiments described herein, the one or more input devices 106 can be employed to operate and/or manipulate the server 102 and/or associate components. Additionally, the one or more input devices 106 can be employed to display one or more outputs (e.g., displays, data, visualizations, and/or the like) generated by the server 102 and/or associate components. Further, in one or more embodiments, the one or more input devices 106 can be comprised within, and/or operably coupled to, a cloud computing environment.

The communications component 112 can receive data from the one or more electronic devices 108 and/or input devices 106 and share the data with the associate components of the signal analysis component 110. For example, the communications component 112 can receive data from the one or more electronic devices 108 and/or input devices 106 via the one or more networks 104 and/or direct electrical connections.

The one or more electronic devices 108 can generate, convert, and/or interpret one or more signals to be analyzed by the signal analysis component 110. For example, one or more signals can be employed by the one or more electronic devices 108 to control one or more hardware components of the electronic devices 108. In another example, one or more signals can be employed by the one or more electronic devices 108 to facilitate one or more observations, detections, measurements, and/or determinations. In various embodiments, the one or more signals can be electrical signals.

Figure 2A:
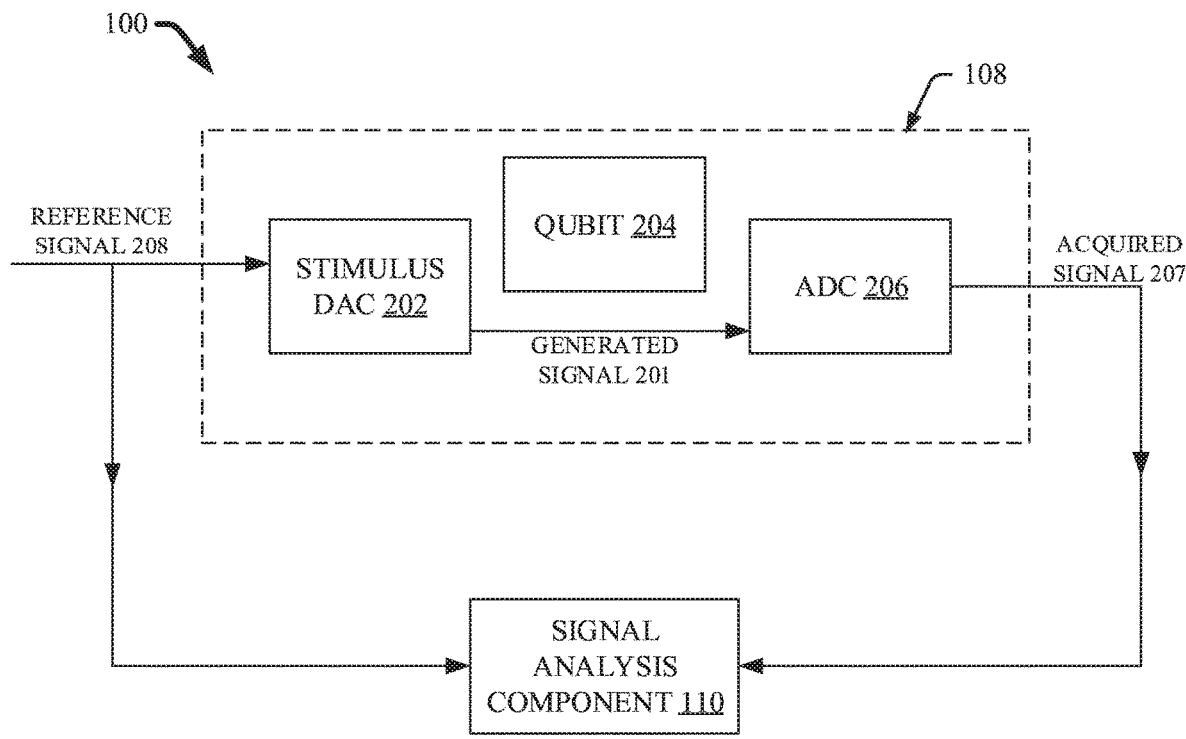
FIG. 2A illustrates a block diagram of an example, non-limiting system that can detect errors in a qubit control signal based on one or more SNR measurements in accordance with one or more embodiments described herein.

FIG. 2A illustrates a block diagram of the example, non-limiting system 100 in which the one or more electronic devices 108 can be one or more quantum computers. Repetitive description of like elements employed in other embodiments described herein is omitted for sake of brevity. One of ordinary skill in the art will recognize that the various features described herein can be employed in electronic devices 108 other than quantum computers, and the quantum computer embodiment illustrated in FIG. 2A provides an exemplary context to describe the features of various embodiments.

In various embodiments, the one or more electronic devices 108 can comprise quantum hardware devices that can utilize the laws of quantum mechanics (e.g., such as superposition and/or quantum entanglement) to facilitate computational processing (e.g., while satisfying the DiVincenzo criteria). In one or more embodiments, the one or more electronic devices 108 can be quantum computers comprising a quantum data plane, a control processor plane, a control and measurement plane, and/or a qubit technology.

In one or more embodiments, the quantum data plane can include one or more quantum circuits comprising physical qubits, structures to secure the positioning of the qubits, and/or support circuitry. The support circuitry can, for example, facilitate measurement of the qubits' state and/or perform gate operations on the qubits (e.g., for a gate-based system). In some embodiments, the support circuitry can comprise a wiring network that can enable multiple qubits to interact with each other. Further, the wiring network can facilitate the transmission of control signals via a direct electrical connection and/or electromagnetic radiation (e.g., optical, microwave, and/or low-frequency signals). For instance, the support circuitry can comprise one or more superconducting resonators operatively coupled to the one or more qubits. As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

In one or more embodiments, the control processor plane can identify and/or trigger a Hamiltonian sequence of quantum gate operations and/or measurements, wherein the sequence executes a program for implementing a quantum algorithm. For example, the control processor plane can convert compiled code to commands for the control and measurement plane. In one or more embodiments, the control processor plane can further execute one or more quantum error correction algorithms.

In one or more embodiments, the control and measurement plane can convert digital signals generated by the control processor plane, which can delineate quantum operations to be performed, into analog control signals to perform the operations on the one or more qubits in the quantum data plane. Also, the control and measurement plane can convert one or more analog measurement outputs of the qubits in the data plane to classical binary data that can be shared with other components of the system 100 (e.g., such as the signal analysis component 110 and/or input devices 106, via, for example, the control processor plane).

One of ordinary skill in the art will recognize that a variety of qubit technologies can provide the basis for the one or more qubits of the one or more quantum computers. Two exemplary qubit technologies can include trapped ion qubits and/or superconducting qubits. For instance, wherein the quantum computer utilizes trapped ion qubits, the quantum data plane can comprise a plurality of ions serving as qubits and one or more traps that serve to hold the ions in specific locations. Further, the control and measurement plane can include: a laser or microwave source directed at one or more of the ions to affect the ion's quantum state, a laser to cool and/or enable measurement of the ions, and/or one or more photon detectors to measure the state of the ions. In another instance, superconducting qubits (e.g., such as superconducting quantum interference devices "SQUIDs") can be lithographically defined electronic circuits that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls. Additional exemplary qubit technologies can include, but are not limited to: photonic qubits, quantum dot qubits, gate-based neutral atom qubits, semiconductor qubits (e.g., optically gated or electrically gated), topological qubits, a combination thereof, and/or the like.

The one or more electronic devices 108 can receive one or more input signals generated, for example, by the one or more input devices 106. The one or more electronic devices 108 can receive the one or more input signals via the one or more networks 104 and/or direct electrical connections. In various embodiments, the one or more input signals can comprise, for example, data to be analyzed the by the one or more electronic devices 108. Further, the one or more input signals can comprise one or more settings directing computations and/or functions to be executed by the one or more electronic devices 108.

The one or more electronic devices 108 can include one or more input generators that can generate and/or transmit one or more generated signals 201 based on the one or more input signals to facilitate operation of the one or more electronic devices 108. Additionally, the one or more electronic devices 108 can include one or more output generators that can generate one or more output signals based on operation of the electronic devices 108. For example, the one or more output generators can generate and/or transmit one or more output signals that characterize results obtained, determined, observed, and/or computed by the one or more electronic devices 108. In various embodiments, the one or more input generators and/or output generators can function to transform signals between one or more formats, such as transforming a digital signal to at least one of: an analog signal, a continuous voltage change, an optical intensity, and/or an optical hue. For example, the one or more input generators can be one or more digital-to-analog converts ("DAC"), and the one or more output generators can be one or more analog-to-digital converters ("ADC").

For instance, the one or more electronic devices 108 can comprise one or more stimulus DACs 202 that can generate and/or transmit one or more generated signals 201 based on one or more received input signals. The one or more generated signals 201 can be control signals employed to control operation of one or more qubits 204 of the quantum computer electronic device 108. Wherein the one or more electronic devices 108 are quantum computers (as exemplified in FIG. 2A), the stimulus DAC 202 can transmit the one or more generated signals 201 to the one or more qubits 204, which can subsequently operate in accordance with the generated signal 201 and transmit operation results to one or more ADCs 206. The one or more ADC's 206 can then generate one or more output signals to be acquired and/or analyzed (e.g., by the one or more input devices 106).

Prior to operation of the one or more electronic devices 108, the signal analysis component 110 can analyze one or more generated signals 201 transmitted by the one or more input generators for erroneous data. The signal analysis component 110 can analyze the one or more generated signals 201 by comparing one or more output signals transmitted by the one or more output generators with one or more known input signals supplied to the one or more input generators. For example, the signal analysis component 110 can analyze one or more generated signals 201 transmitted by one or more stimulus DACs 202 prior to the electronic device 108 employing the generated signals 201 to control the one or more qubits 204. In various embodiments, the signal analysis component 110 can analyze the one or more generated signals 201 by comparing one or more acquired signals 207 outputted by the one or more ADCs 206 with one or more reference signals 208 supplied to the one or more stimulus DACs 202.

Figure 2B:
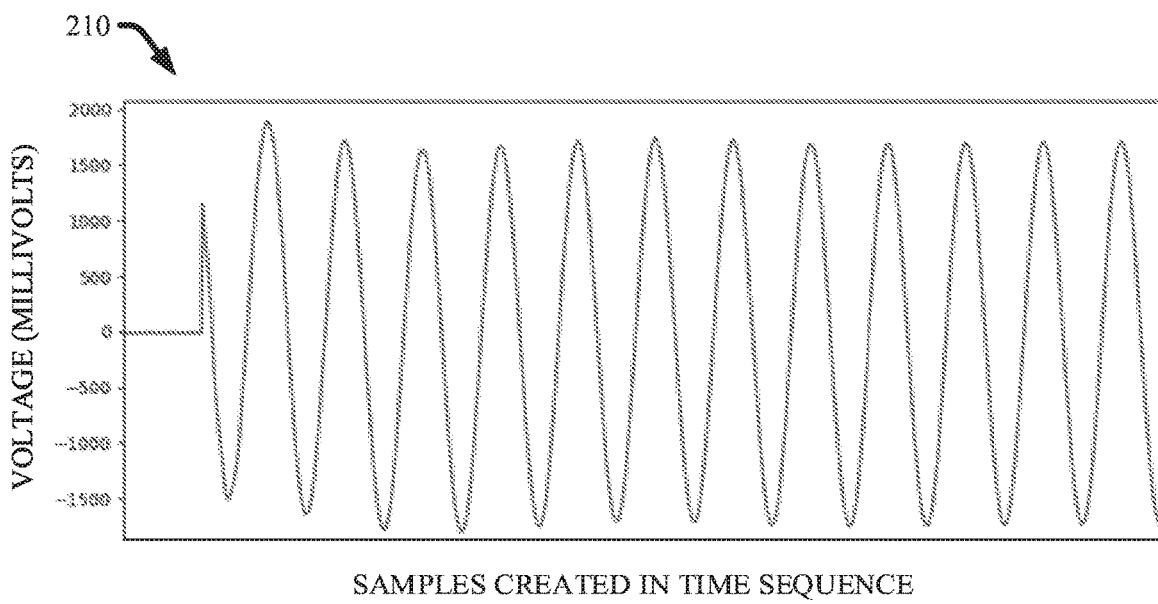
FIG. 2B illustrates a diagram of an example, non-limiting graph of an acquired signal that can be evaluated by one or more autonomous systems based on one or more SNR measurements in accordance with one or more embodiment described herein.

FIG. 2B illustrates a diagram of an example, non-limiting graph 210 that can characterize an acquired signal 207 transmitted by one or more output generators (e.g., ADCs 206) and/or analyzed by the signal analysis component 110 in accordance with one or more embodiments described herein. Repetitive description of like elements employed in other embodiments described herein is omitted for sake of brevity. As described herein, the signal analysis component 110 can analyze the acquired signal 207 characterized by graph 210 in comparison with one or more reference signals 208 to identify one or more or more errors propagated in the one or more generated signals 201. For example, the one or more errors can be spurs and/or glitches in the generated signals 201 and can be characterized in the acquired signals 207 by a signal pulse delay, a signal pulse saturation, a decrease in amplitude between signal pulses, and/or a phase shift between signal pulses.

In various embodiments the reference component 114 can alter a sampling rate of the reference signal 208 to match a sampling rate of the acquired signal 207. For example, the reference component 114 can determine the length of the acquired signal 207 to compute how many samples to analyze from the reference signal 208. As shown in FIG. 2B, the acquired signal 207 can have a length characterized by the samples created in time sequence of the x-axis of graph 210. The reference component 114 can analyze a graph characterizing the acquired signal 207 (e.g., exemplified by graph 210) to determine the length of the acquired signal 207. Further, the reference component 114 can alter the sampling rate of the reference signal 208 and/or acquired signal 207 to match each other. For example, the reference component 114 can alter the sampling rate of the reference signal 208 such that the reference component 114 samples a segment of the reference signal 208 with an equivalent length as the acquired signal 207. For instance, the reference component 114 can down-sample the reference signal 208 to match the sampling rate of the acquired signal 207. In another instance, the reference component 114 can down-sample the acquired signal 207 to match the reference signal 208. One or more down-sampling techniques that can be employed by the reference component 114 can include, but are not limited to: interpolation, down-sampling filtration, conversion to and/or from the frequency domain, a combination thereof, and/or the like. Thereby, the reference component 114 can prepare the reference signal 208 for cross correlation with the acquired signal 207.

Figure 3:
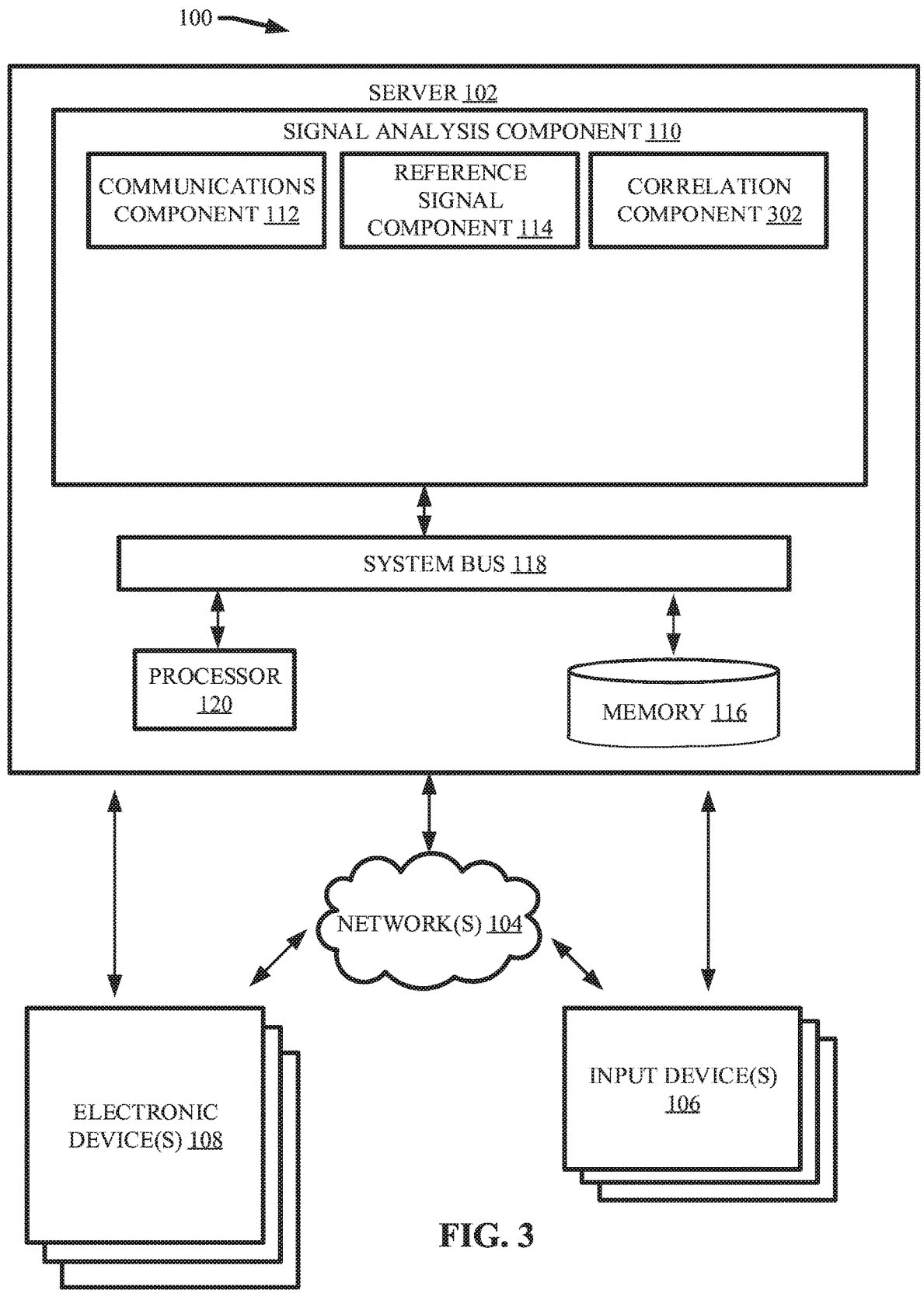
FIG. 3 illustrates a block diagram of an example, non-limiting system that can cross correlate one or more generated signals and/or acquired signals to facilitate the determination of a SNR in accordance with one or more embodiment described herein.

FIG. 3 illustrates a diagram of the example, non-limiting system 100 further comprising correlation component 302 in accordance with one or more embodiments described herein. Repetitive description of like elements employed in other embodiments described herein is omitted for sake of brevity. In various embodiments, the correlation component 302 can execute a cross-correlation algorithm to generate an overlay of the reference signal 208 and the acquired signal 207.

In one or more embodiments, the correlation component 302 can execute one or more cross-correlation algorithms to overlay the reference signal 208 (e.g., down-sampled reference signal 208) and the acquired signal 207. One or more techniques and/or algorithms that can be employed by the correlation component 302 to facilitate cross-correlation between the altered reference signal 208 (e.g., down-sampled reference signal 208) and the acquired signal 207 can include, but are not limited to, the numpy.correlate function (e.g., implemented with full mode, same mode, or valid mode) and/or the like. The overlay can distinguish one or more delays (e.g., wire delays) between the two signals. Further, in one or more embodiments, the correlation component 302 can overlay the reference signal 208 and acquired signal 207 in a time-domain, rather than, for example, a frequency spectrum. The one or more cross correlation algorithms employed by the correlation component 302 can be used to determine the center of the best overlays of the two signals. The sample-index (e.g., time) of the maximum value of correlation function (e.g., numpy-.correlate) can be the best correlation of the two signals. Once the correlation component 302 identifies the middle of both signals (e.g., the reference signal 208 and the acquired signal 207), one can be over-laid onto the other. Thereby, the correlation component 302 can employ one or more cross-correlation algorithms to determine how much to shift one of the signals to best overlay both signals in manner that facilitates subsequent sample-wise comparison of the two signals by the signal analysis component 110. In one or more embodiments, if the two signals do not overlay each other, one or more of the signals can be cropped.

Figure 4:
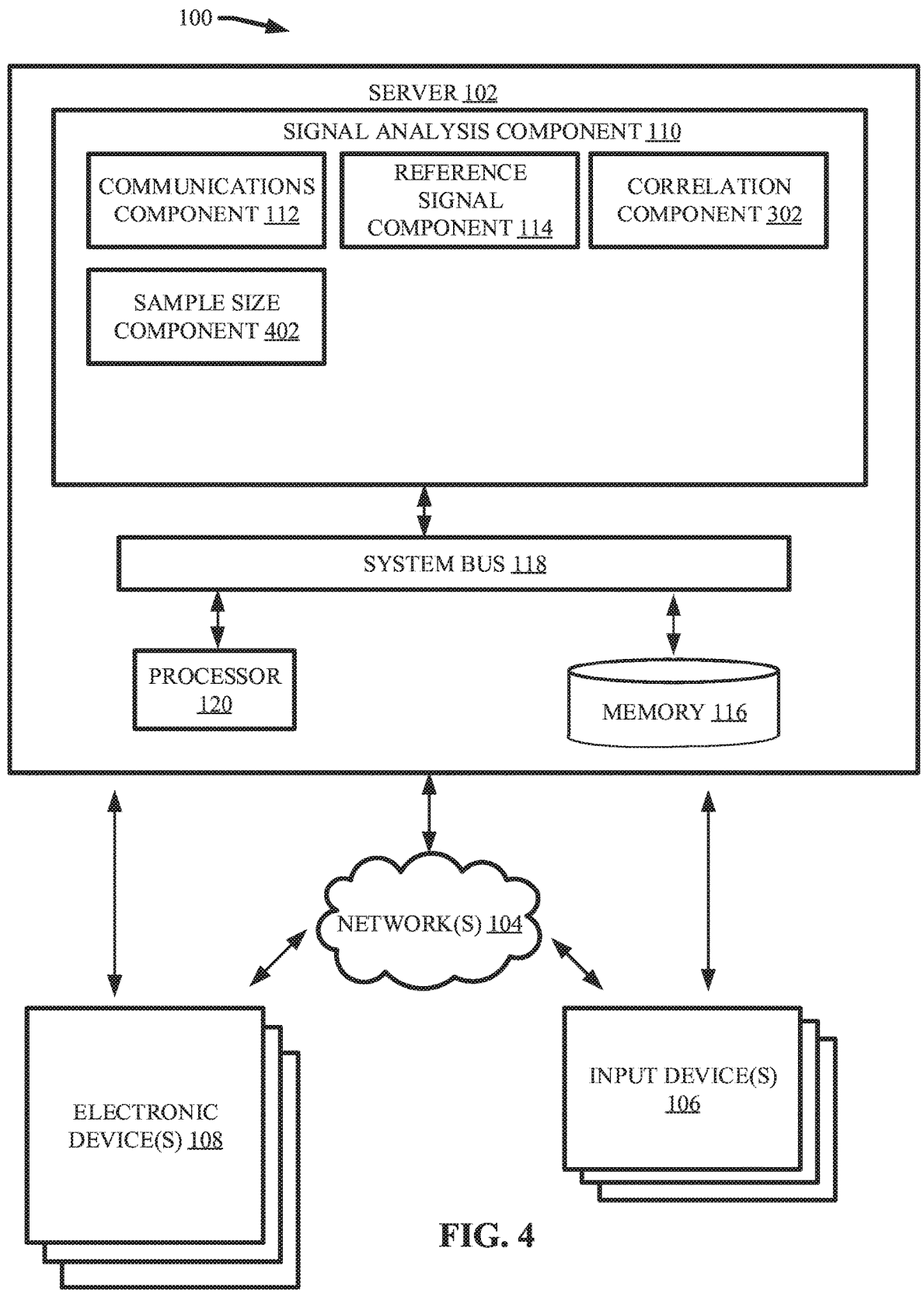
FIG. 4 illustrates a block diagram of an example, non-limiting system that can crop one or more generated signal samples and/or acquired signal samples to facilitate the determination of a SNR in accordance with one or more embodiment described herein.

FIG. 4 illustrates a diagram of the example, non-limiting system 100 further comprising sample size component 402 in accordance with one or more embodiments described herein. Repetitive description of like elements employed in other embodiments described herein is omitted for sake of brevity. In various embodiments, the sample size component 402 can render the altered reference signal 208 (e.g., down-sampled reference signal 208) and the acquired signal 207 the same sample size based on the overlay.

In one or more embodiments, the overlay achieved by the correlation component 302 can direct one or more sizing alterations performed by the sample size component 402. For example, the sample size component 402 can crop the altered reference signal 208 (e.g., down-sampled reference signal 208) and/or the acquired signal 207 based on the overlay in order to achieve a uniform sample size with regards to both signals. Performing the size alterations absent an overlay of the signals can result in one or more relevant portions of the signals being removed. By analyzing the overlay, the sample size component 402 can simultaneous determine how a given size alteration will affect both the altered reference signal 208 (e.g., down-sampled reference signal 208) and/or the acquired signal 207.

For example, the sample size component 402 can analyze the overlay to identify one or more segments that include characteristics of both signals that can be relevant for analysis by the signal analysis component 110. Characteristics that can be targeted by the sample size component 402 for inclusion in the one or more identified segments can include, but are not limited to: a number of pulses in the signals, frequency of signal pulses, amplitude of signal pulses, length of signal pulses, a distance between signal pulses, phase (e.g., including phase discontinuities) of the signal pulses, a combination thereof, and/or the like. Deviations in these features between the altered reference signal 208 (e.g., down-sampled reference signal 208) and/or the acquired signal 207 can be indicative of errors in the generated signal 201. Once the sample size component 402 identifies segments of the overlay comprising target characteristics of both signals (e.g., via a graphical analysis, wherein the overlay is characterized by a graph such as exemplary graph 210), the sample size component 402 can crop the overlay to isolate the identified segments; and thereby target the identified segments for further analysis by the signal analysis component 110.

Figure 5:
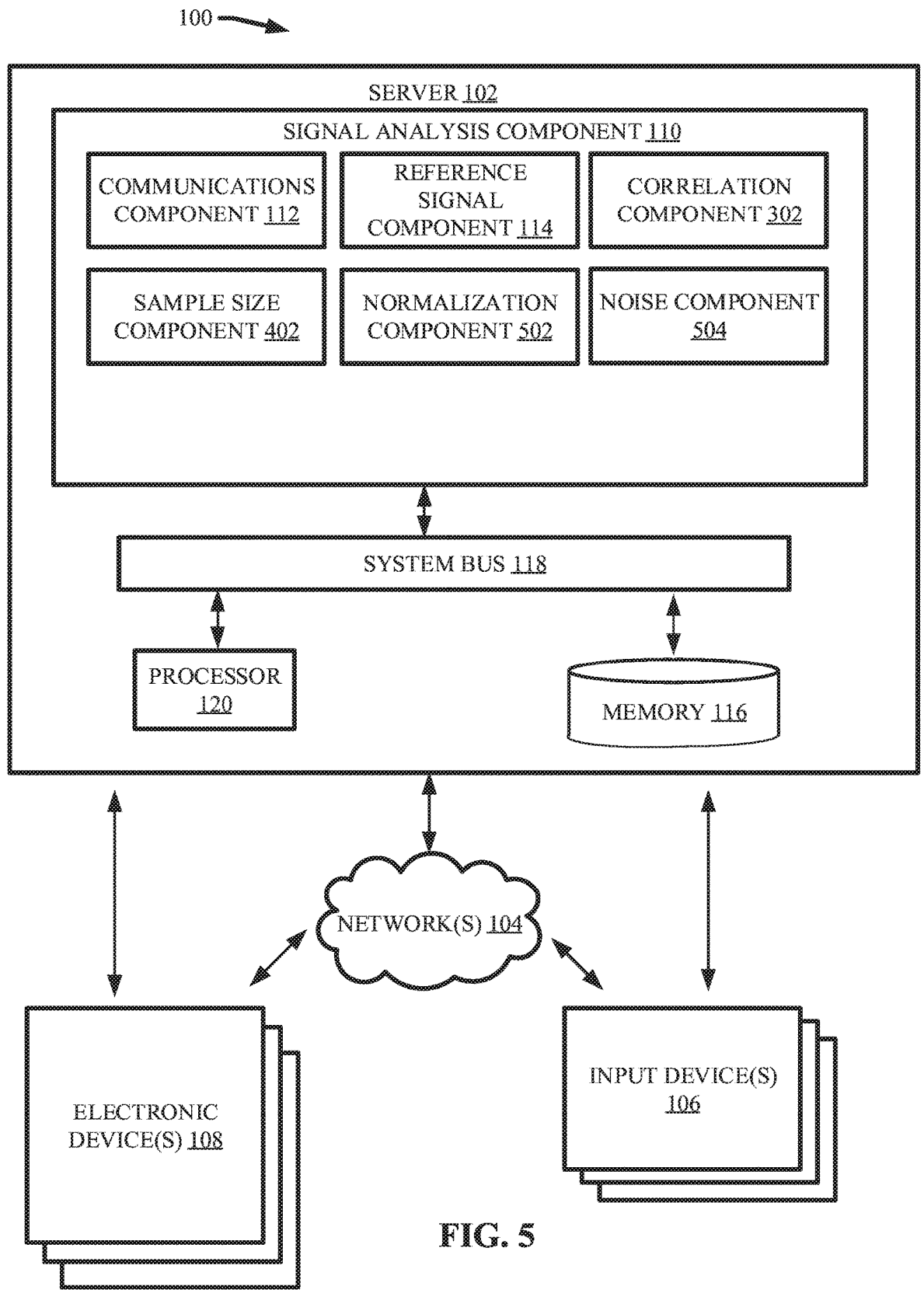
FIG. 5 illustrates a block diagram of an example, non-limiting system that can normalize one or more cropped and/or sampled generated signals and/or acquired signals to facilitate the determination of a SNR in accordance with one or more embodiment described herein.

FIG. 5 illustrates a diagram of the example, non-limiting system 100 further comprising normalization component 502 and/or noise component 504 in accordance with one or more embodiments described herein. Repetitive description of like elements employed in other embodiments described herein is omitted for sake of brevity. In various embodiments, the normalization component 502 can further normalize the reference signal 208 (e.g., the down-sized and cropped reference signal 208) and/or the acquired signal 207 (e.g., the cropped acquired signal 207) to within a defined range.

In one or more embodiments, the normalization component 502 can employ one or more normalization techniques with regards to the altered reference signal 208 and/or acquired signal 207. Example normalization techniques can include, but are not limited to: normalization to the measured maximum and minimum signal, normalization to a known range of the ADC, a combination thereof, and/or the like. For instance, the normalization component 502 can employ one or more normalization techniques to normalize each index of the reference signal 208 (e.g., down-sampled and cropped reference signal 208) to a normalization value between 0 and 1. Likewise, the normalization component 502 can employ one or more normalization techniques to normalize each index of the acquired signal 207 (e.g., cropped acquired signal 207) to a normalization value between 0 and 1.

In various embodiments, the noise component 504 can further compare the normalized indexes from the reference signal 208 and acquired signal 207 to determine one or more noise signals. For example, the noise component 504 can define the noise signal as the difference between the normalized reference signal 208 and the normalized acquired signal 207. The noise signal can characterize noise formed when generating and/or transmitting the generated signal 201 (e.g., via the one or more signal generators, such as stimulus DAC 202). In one or more embodiments, the noise characterized by the noise signal can include one or more errors in the generated signal 201 that are subject to detection by the signal analysis component 110.

Figure 6:
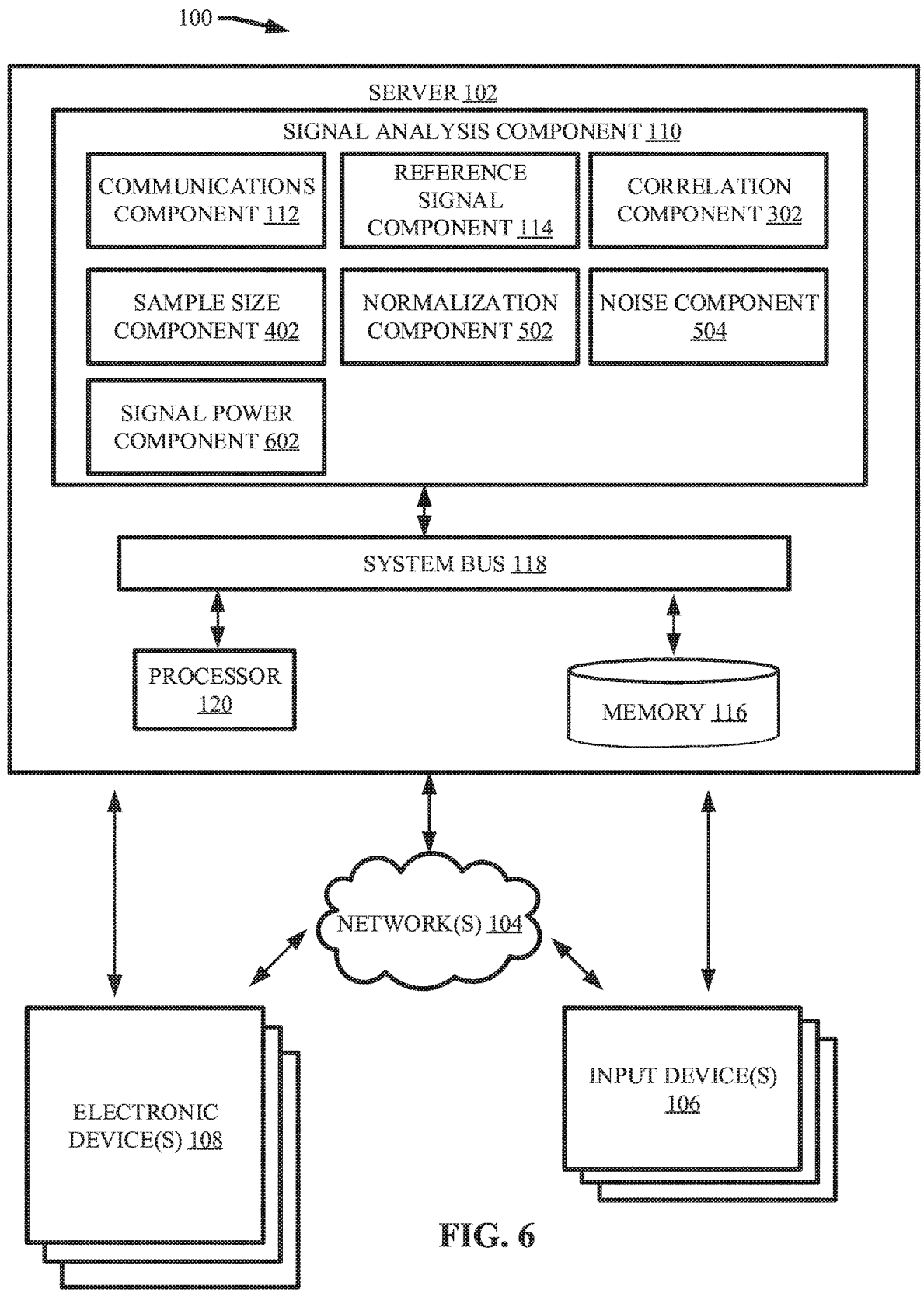
FIG. 6 illustrates a block diagram of an example, non-limiting system that can compute the power of one or more normalized signals to facilitate the determination of a SNR in accordance with one or more embodiment described herein.

FIG. 6 illustrates a diagram of the example, non-limiting system 100 further comprising signal power component 602 in accordance with one or more embodiments described herein. Repetitive description of like elements employed in other embodiments described herein is omitted for sake of brevity. In various embodiments, the signal power component 602 can determine the signal power of the reference signal 208 based on the normalized reference signal 208 and/or signal power of the noise signal.

In one or more embodiments, the signal power component 602 can analyze the normalized referenced signal 208 (e.g., previously down-sampled and/or cropped in accordance with the various embodiments described herein) to determine a signal value regarding the reference signal 208. Further, the signal value can be employed in one or more subsequent signal-to-noise ratio ("SNR") computations and/or can characterize a power of the reference signal 208. For example, the signal value computed by the signal power component 602 can be equal to a summation of the square values of each sample included in the normalized, down-sampled, and cropped reference signal 208. Likewise, the signal power component 602 analyze the noise signal computed by the noise component 504 to determine a noise signal power value characterizing the noise incorporated in the generated signal 201. The noise signal power value can also be employed in the one or more subsequent SNR computations in accordance with various embodiments described herein. For example, the noise signal power value computed by the signal power component 602 can be equal to a summation of the square values of each sample included in the noise signal determined by the noise component 504.

Figure 7:
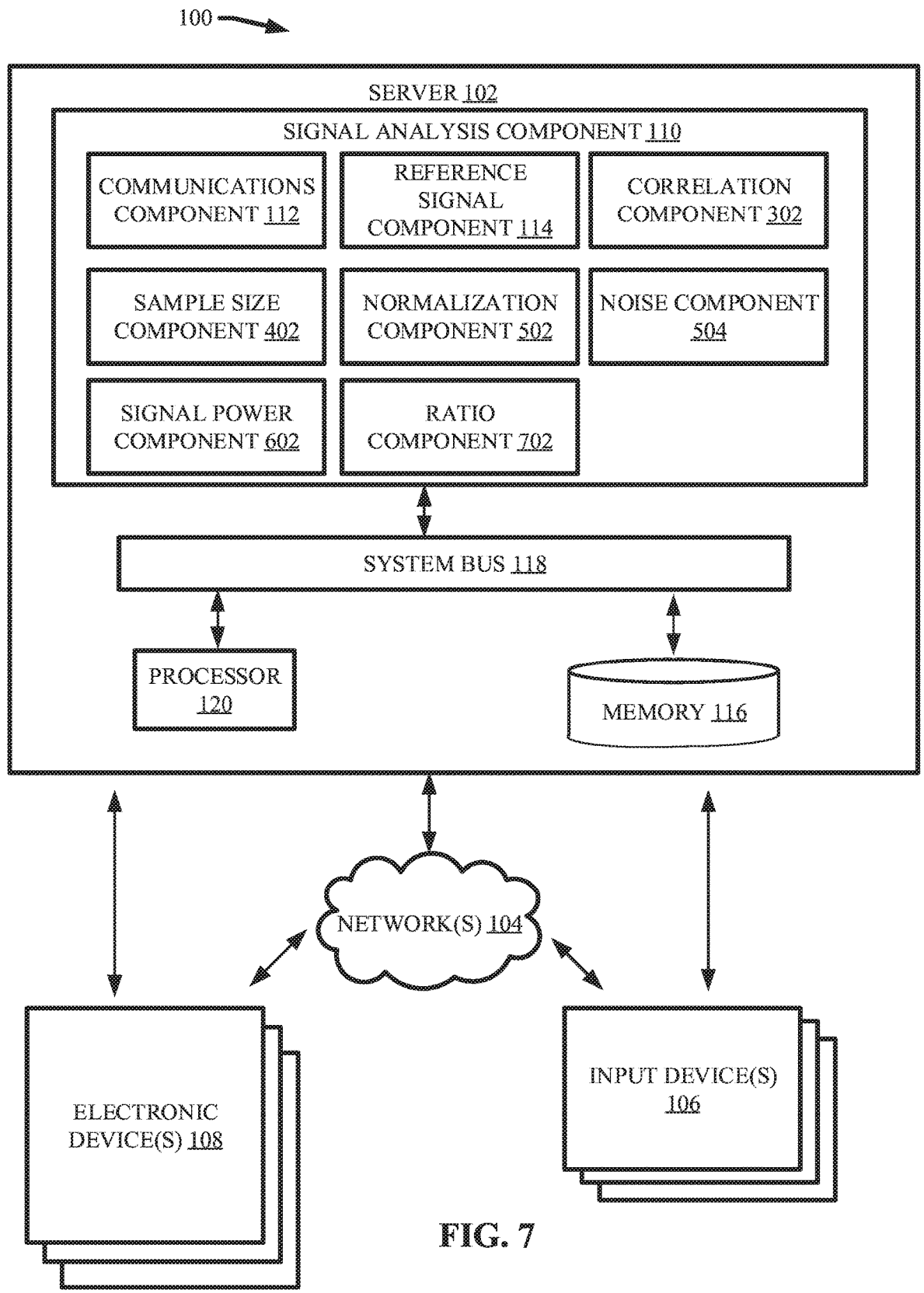
FIG. 7 illustrates a block diagram of an example, non-limiting system that can compute one or more SNRs in accordance with one or more embodiments described herein.

FIG. 7 illustrates a diagram of the example, non-limiting system 100 further comprising ratio component 702 in accordance with one or more embodiments described herein. Repetitive description of like elements employed in other embodiments described herein is omitted for sake of brevity. In various embodiments, the ratio component 702 can incorporate the power values computed by the signal power component 602 regarding the reference signal 208 and noise signal into one or more SNR computations to determine an SNR value. Thereby, the SNR value can characterize the generated signal 201 and be based on the reference signal 208 and the noise signal determined from differences between the reference signal 208 and the acquired signal 207. For instance, the ratio component 702 can compute the SNR value in accordance with Equation 1 below.

$$SNR\ Value = 10 * \log_{10} \frac{Signal\ Value - Noise\ Signal\ Value}{Noise\ Signal\ Value} \quad (1)$$

As described herein, the "signal value" and the "noise signal value" can be computed by the signal power component 602. For example, the signal value can be the summation of the square values of each sample included in the normalized, down-sampled, and cropped reference signal 208. Also, the noise signal value can be the summation of the square values of each sample included in the noise signal determined by the noise component 504.

Figure 8:
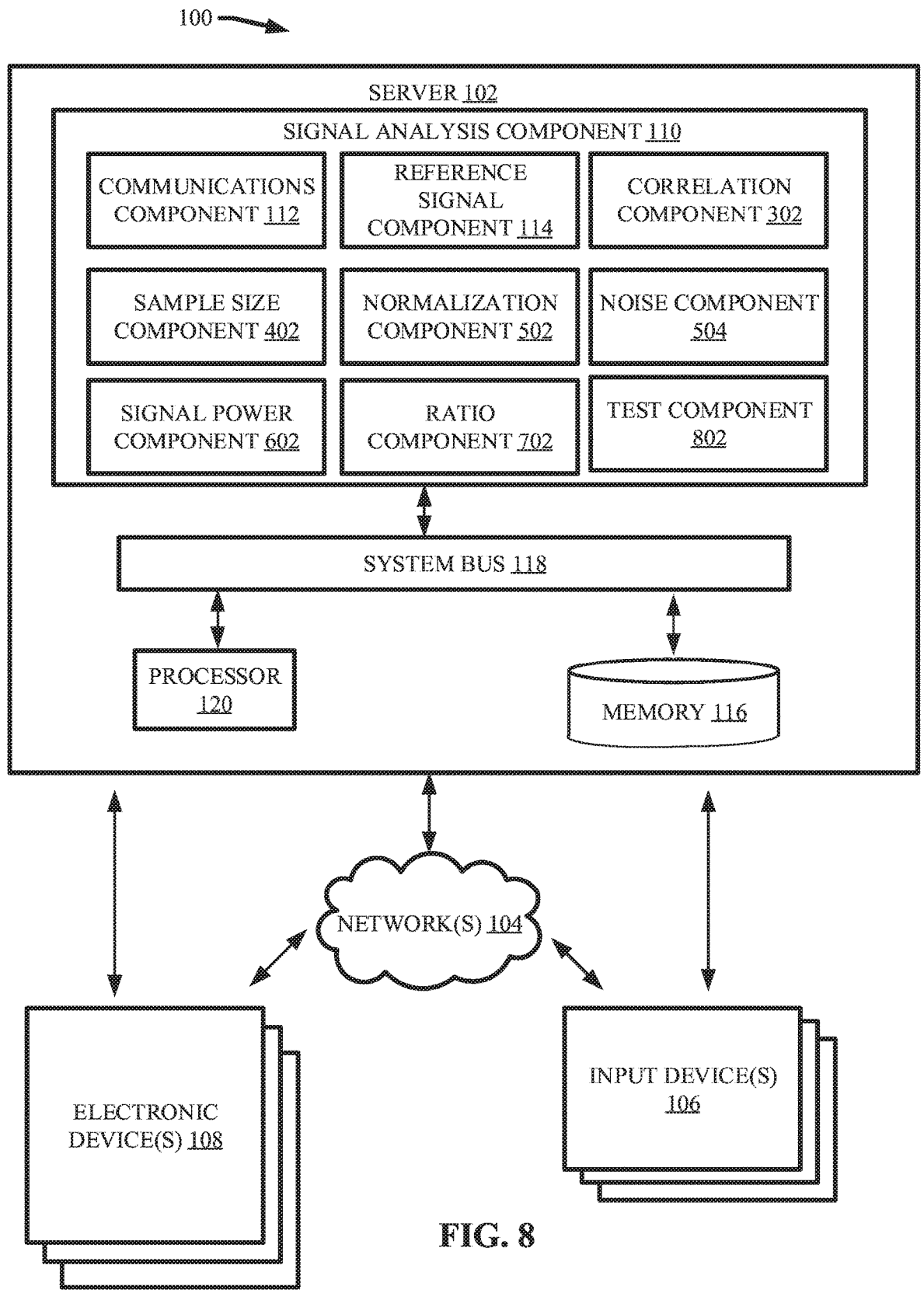
FIG. 8 illustrates a block diagram of an example, non-limiting system that can utilize one or more reference SNR measurements to evaluate the quality of one or more acquired signals in accordance with one or more embodiments described herein.

FIG. 8 illustrates a diagram of the example, non-limiting system 100 further comprising test component 802 in accordance with one or more embodiments described herein. Repetitive description of like elements employed in other embodiments described herein is omitted for sake of brevity. In various embodiments, the test component 802 can determine whether a second generated signal 201 comprises an error by comparing the SNR value of a previously evaluated generated signal 201 to a second SNR value of the second generated signal 201.

In various embodiments, the signal analysis component 110 can execute the functions of the reference signal component 114, the correlation component 302, the sample size component 402, the normalization component 502, the noise component 504, the signal power component 602, and/or the ratio component 702 on one or more generated signals 201 known to be associated with: high quality (e.g., error-free or substantially error-free) and/or a known reference signal 208. Further, the test component 802 can save the SNR values computed from the high quality generated signals 201 as benchmarks. For instance, the test component 802 can save the one or more benchmarks in the one or more memories 116. In one or more embodiments, the benchmarks can serve as an indication of what the SNR value associated with a given reference signal 208 should be equivalent to, or substantially equivalent to, if the generated signal 201 is free of errors, or substantially free of errors.

Subsequently, when analyzing the quality of given generated signal 201, the signal analysis component 110 can compute an associate SNR value in accordance with the various embodiments described herein, and the test component 802 can compare the associate SNR value of the given generated signal 201 with one or more benchmark SNR values associated with the reference signal 208 and stored in the one or more memories 116. If the associate SNR value deviates from the benchmark SNR value by greater than or equal to a deviation threshold, the test component 802 can determine that the given generated signal 201 characterized by the associate SNR value comprises an unacceptable amount of errors (e.g., spurious data). In contrast, if the associate SNR value deviates from the benchmark SNR value by less than the deviation threshold, the test component 802 can determine that the given generated signal 201 characterized by the associate SNR value is acceptable. In one or more embodiments, the deviation threshold can be defined by the one or more input devices 106 and/or can vary based on the electronic device 108 and/or the type of reference signal 208.

Figure 9:
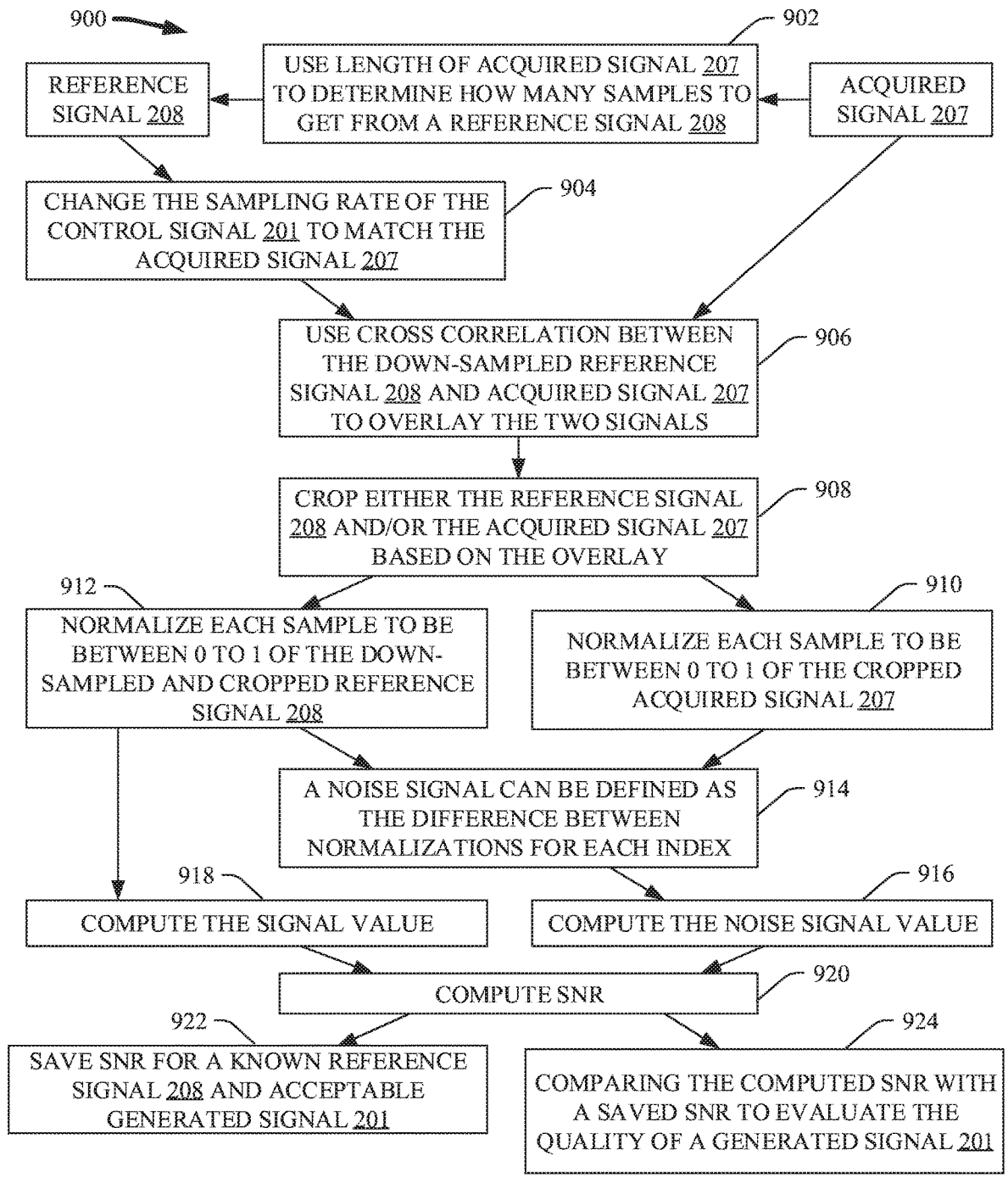
FIG. 9 illustrates a flow diagram of an example, non-limiting computer-implemented method that can facilitate detecting one or more errors in a signal based on one or more SNR measurements in accordance with one or more embodiments described herein.

FIG. 9 illustrates a flow diagram of an example, non-limiting operating procedure 900 that can be employed by the signal analysis component 110 to analyze one or more generated signals 201 in accordance with one or more embodiments described herein. Repetitive description of like elements employed in other embodiments described herein is omitted for sake of brevity.

At 902, the operating procedure 900 can comprise using (e.g., via reference component 114) the length of an acquired signal 207 to determine how many samples to get from a reference signal 208. At 904, the operating procedure 900 can comprise changing (e.g., via reference component 114) the sampling rate of the reference signal 208 to match the acquired signal 207. For example, the reference component 114 can down-sample the reference signal 208 at 904 based on the length of the acquired signal 207 determined at 902. Alternatively, in one or more embodiment, the reference signal 208 can down-sample the acquired signal 207 to match the reference signal 208.

At 906, the operating procedure 900 can comprise using (e.g., via correlation component 302) cross correlation between the down-sampled reference signal 208 and the acquired signal 207 to overlay the two signals. For example, the correlation component 302 can utilize one or more cross correlation techniques described herein to overlay the two signals on a graphical representation, such as the example graph 210. Further, at 908 the operating procedure 900 can comprise cropping (e.g., via sample size component 402) either the reference signal 208 and/or the acquired signal 207 based on the overlay achieved at 906. For instance, the sample size component 402 can crop the reference signal 208 and/or the acquired signal 207 so as to render a uniform sample size for both signals in accordance with various embodiments described herein.

At 910, the operating procedure 900 can comprise normalizing (e.g., via normalization component 502) each sample to be between 0 to 1 of the cropped acquired signal 207. Likewise, at 912 the operating procedure 900 can comprise normalizing (e.g., via normalization component 502) each sample to be between 0 to 1 of the down-sampled and cropped reference signal 208. In accordance with various embodiments described herein, the normalization component 502 can employ one or more normalization techniques to the altered reference signal 208 and/or acquired signal 207 to enhance cohesion between the data of the two signals. Further, at 914 the operating procedure 900 can comprise defining (e.g., via noise component 504) a noise signal as the difference between the normalizations for each index of the normalized reference signal 208 and the normalized acquired signal 207.

At 916, the operating procedure 900 can comprise computing (e.g., via signal power component 602) the noise signal power associated with the noise signal. Also, at 918 the operating procedure 900 can comprise computing (e.g., via signal power component 602) the signal value associated with the normalized reference signal 208. For example, the signal value can be the summation of the square values of each sample included in the normalized, down-sampled, and cropped reference signal 208. Also, the noise signal value can be the summation of the square values of each sample included in the noise signal determined by the noise component 504.

At 920, the operating procedure 900 can comprise computing (e.g., via ratio component 702) one or more SNR values based on the signal value and noise signal value computations. For example, the one or more SNR values can be computed at 920 in accordance with Equation 1 described herein. At 922, the operating procedure 900 can comprise saving (e.g., via test component 802) the one or more SNR values for a known reference signal 208 and acceptable generated signal 201. For example, the one or more SNR values can be saved as benchmarks and subsequently used by the signal analysis component 110 to evaluate other generated signals 201. Alternatively, the operating procedure 900 can proceed to 924 and comprise comparing (e.g., via test component 802) the one or more SNR values computed at 920 with one or more saved SNR values (e.g., benchmark SNR values) to evaluate the quality of a generated signal 201. For example, the test component 802 can determine whether the computed SNR value deviates from the saved SNR value by greater than a deviation threshold to facilitate an evaluation of the generated signal 201 in accordance with the various embodiments described herein.

Figure 10:
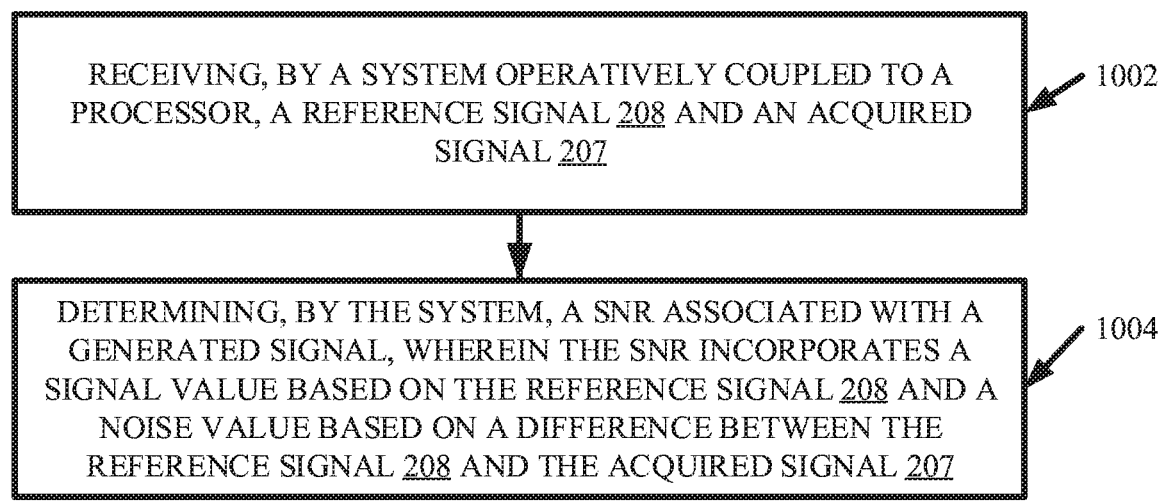
FIG. 10 illustrates a flow diagram of an example, non-limiting computer-implemented method that can facilitate detecting one or more errors in a signal based on one or more SNR measurements in accordance with one or more embodiments described herein.
Figure 11:
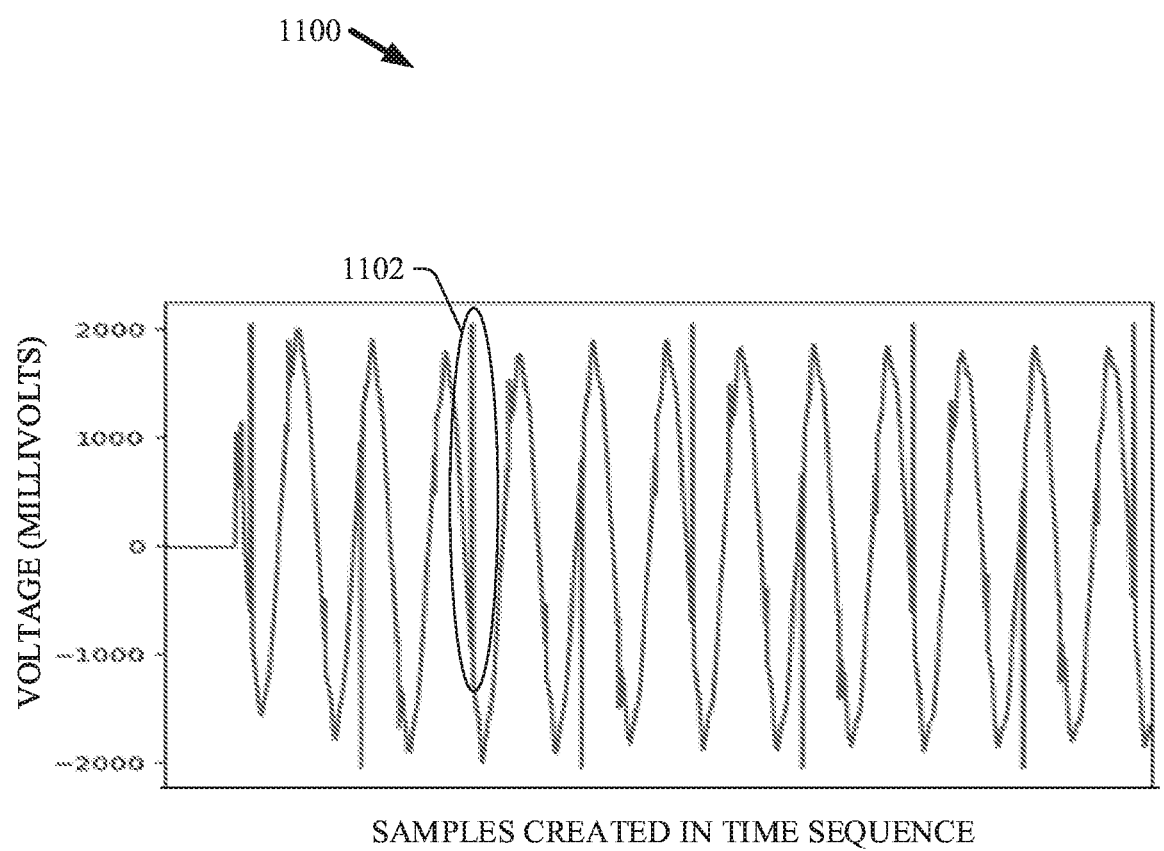
FIG. 11 illustrates a diagram of an example, non-limiting graph of an acquired signal that comprises undesirable spurs that can be autonomously detected by one or more systems in accordance with one or more embodiments described herein.

FIG. 10 illustrates a flow diagram of an example, non-limiting computer-implemented method 1000 that can be implemented by the signal analysis component 110 in accordance with one or more embodiments described herein. Repetitive description of like elements employed in other embodiments described herein is omitted for sake of brevity.

At 1002, the computer-implemented method 1000 can comprise receiving (e.g., via communications component 112), by a system 100 operatively coupled to a processor 120, one or more reference signals 208 and acquired signals 207. In accordance with various embodiments described herein, the one or more reference signals 208 can be generated by the one or more input devices 106. Further, the one or more acquired signals 207 can be generated and/or transmitted by the one or more electronic devices 108. In various embodiments, the one or more acquired signals 207 can characterize one or more generated signals 201 employed by the electronic device 108. For instance, the one or more reference signals 208 can be inputted to the one or more electronic devices 108 to direct and/or facilitate operation of the one or more electronic devices 108. Additionally, the one or more acquired signals 207 can characterize a generated signal 201 employed by the electronic device to control one or more qubits 204 based on the reference signal 208.

At 1004, the computer-implemented method 1000 can comprise determining (e.g., via signal analysis component 110), by the system 100, one or more SNR values associated with a generated signal 201, wherein the one or more SNR values can incorporate a signal value based on the one or more reference signals 208 and a noise value based on a difference between the one or more reference signals 208 and acquired signals 207. For instance, the one or more SNR values determined at 1004 can be computed in accordance with steps 902-920 of operating procedure 900 and/or in accordance with the various embodiments described herein.

In one or more embodiments, the determining at 1004 can be employed by the computer-implemented method 1000 to compute one or more benchmark SNR values that can characterize acceptable generated signals 201 associated with a given reference signal 208. For example, the one or more computed SNR values can be saved in one or more memories 116 to facilitate subsequent evaluations of one or more other generated signals 201. In various embodiments, the benchmark SNR values can be previously determined, saved, and/or provided; wherein the SNR value determined at 1004 can be compared (e.g., via test component 802) with the one or more benchmark SNR values to evaluate the generated signal 201. For example, an acceptability of the generated signal 201 can be determined based on the amount of deviation between the benchmark SNR value and the computed SNR value with regards to the given reference signal 208.

FIGS. 11-14 illustrate diagrams of example, non-limiting graphs that can characterized acquired signals 207 evaluated to be acceptable by the signal analysis component 110 or determined by the signal analysis component 110 to include one or more errors in accordance with one or more embodiments described herein. Repetitive description of like elements employed in other embodiments described herein is omitted for sake of brevity. The graphs of FIGS. 11-14 characterize acquired signals 207 with regards to samples created in time sequence (e.g., x-axis) and millivolts (e.g., y-axis).

For example, graph 210 of FIG. 2B can characterize an acquired signal 207 that can be found acceptable by the signal analysis component 110. In comparison, graph 1100 of FIG. 11 can characterize an acquired signal 207 that can be found to be unacceptable by the signal analysis component 110 due to the inclusion of numerous signal inconsistencies 1102 (e.g., spurs) that can be indicative of one or more errors in the generated signal 201. One of ordinary skill in the art will recognize that while only a single signal inconsistency 1102 is delineated in FIG. 11, graph 1100 comprises a plethora of similar signal inconsistencies 1102 throughout the acquired signal 207.

Figure 12:
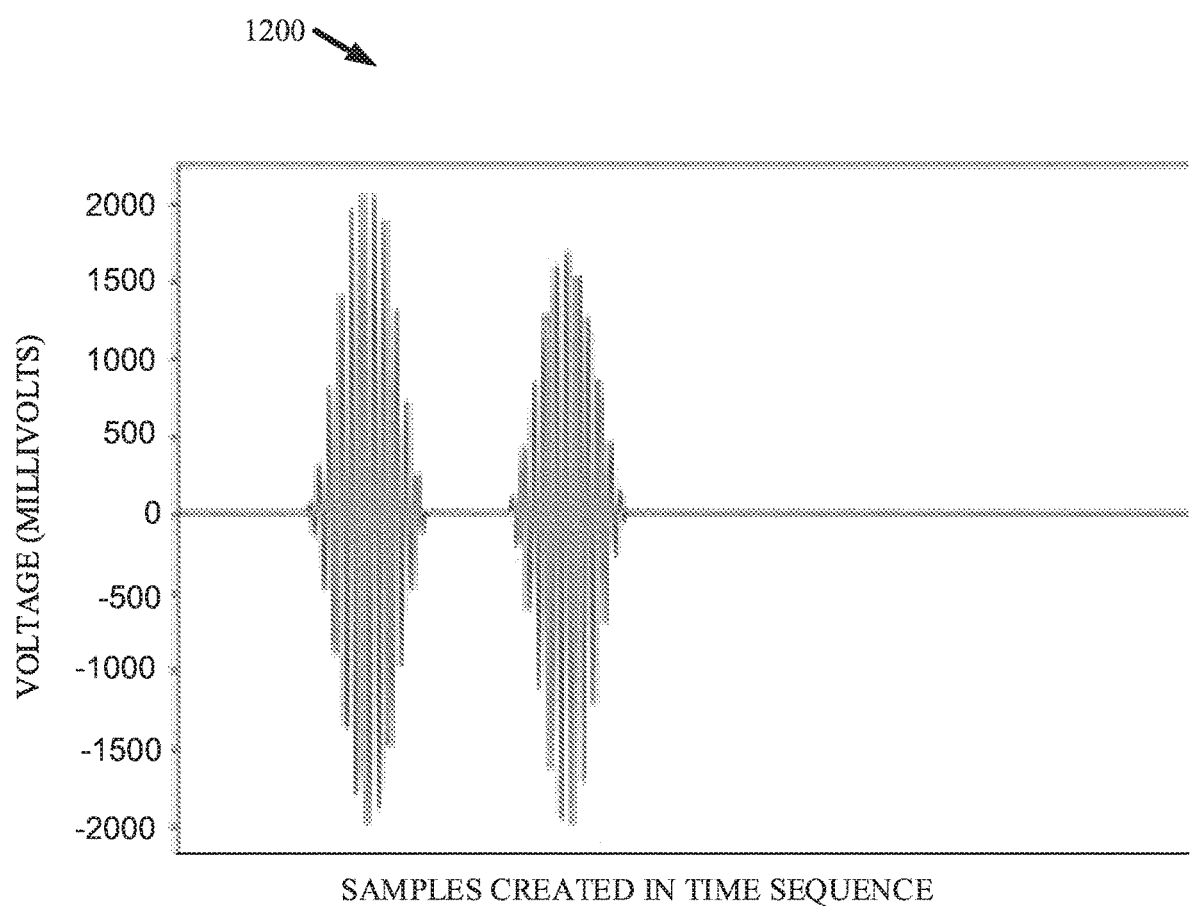
FIG. 12 illustrates a diagram of an example, non-limiting graph of an acquired signal that can be evaluated by one or more autonomous systems based on one or more SNR measurements in accordance with one or more embodiment described herein.
Figure 13:
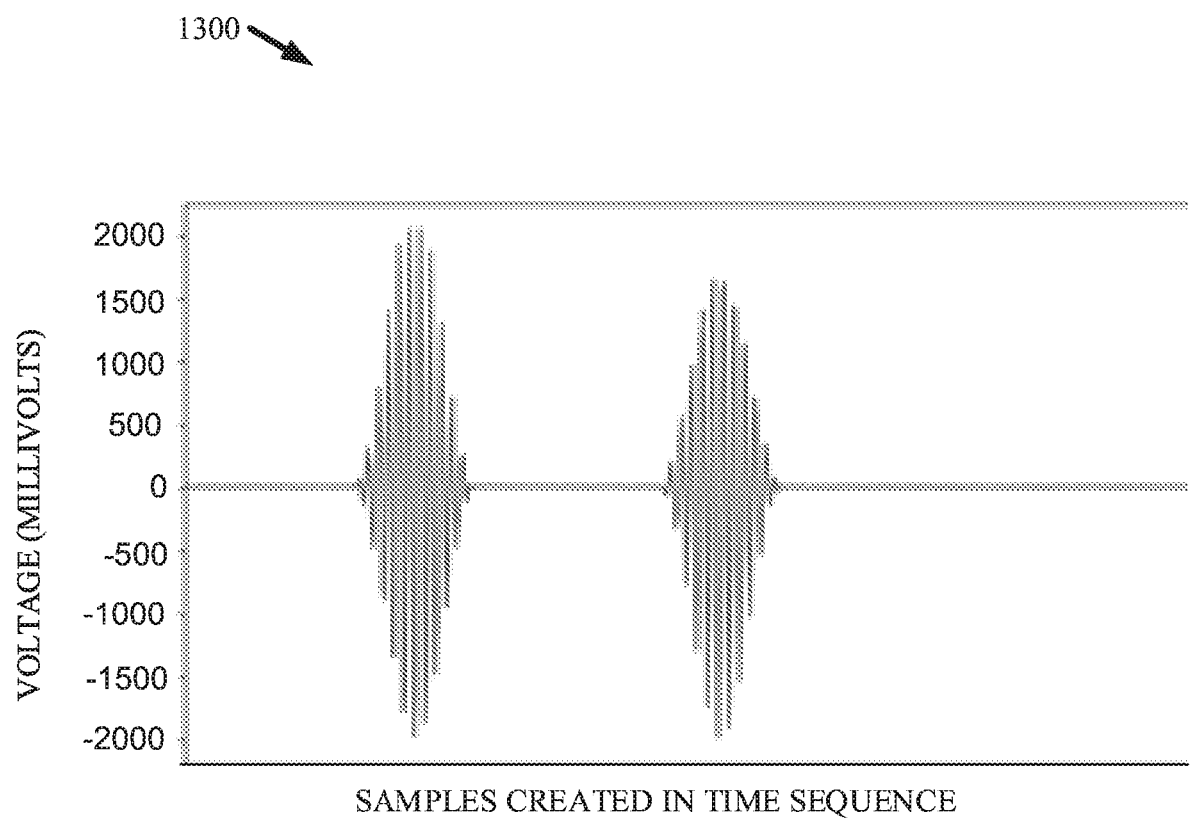
FIG. 13 illustrates a diagram of an example, non-limiting graph of an acquired signal that comprises an undesirable delay between pulses that can be autonomously detected by one or more systems in accordance with one or more embodiments described herein.
Figure 14:
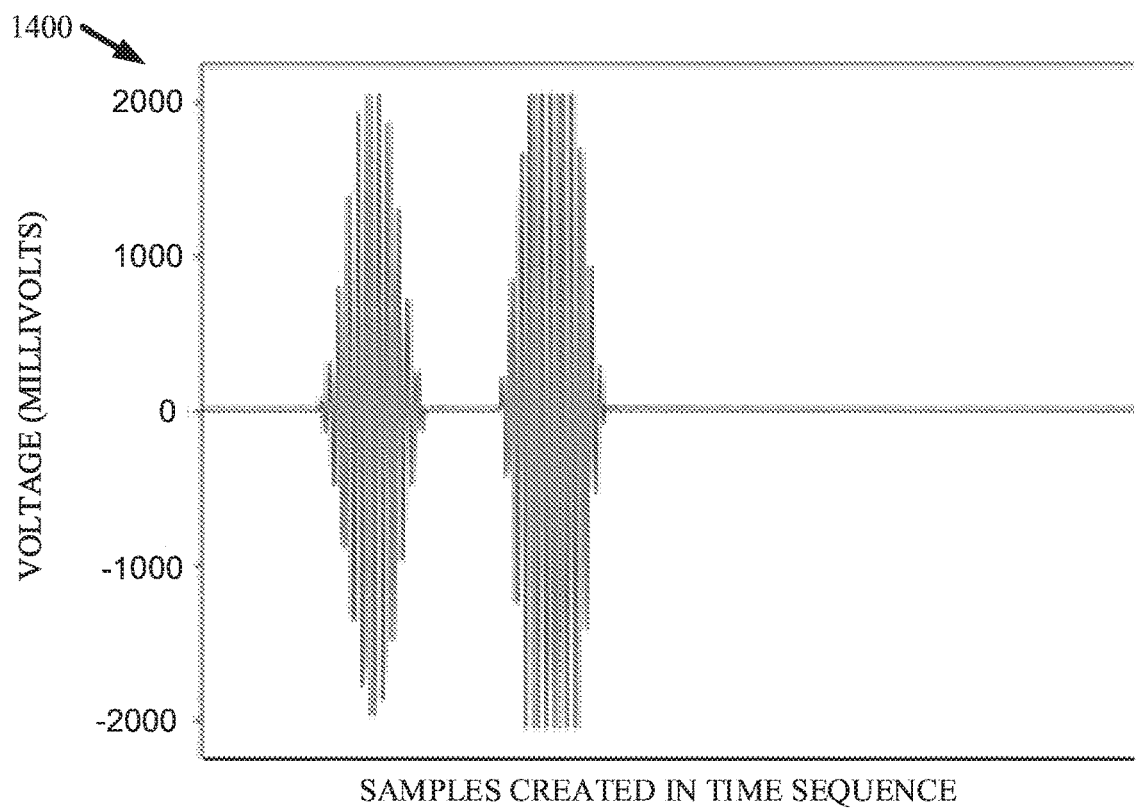
FIG. 14 illustrates diagrams of example, non-limiting graphs of acquired signals that comprise undesirable pulse saturations or decreases in amplitudes that can be autonomously detected by one or more systems in accordance with one or more embodiments described herein.
Figure 14:
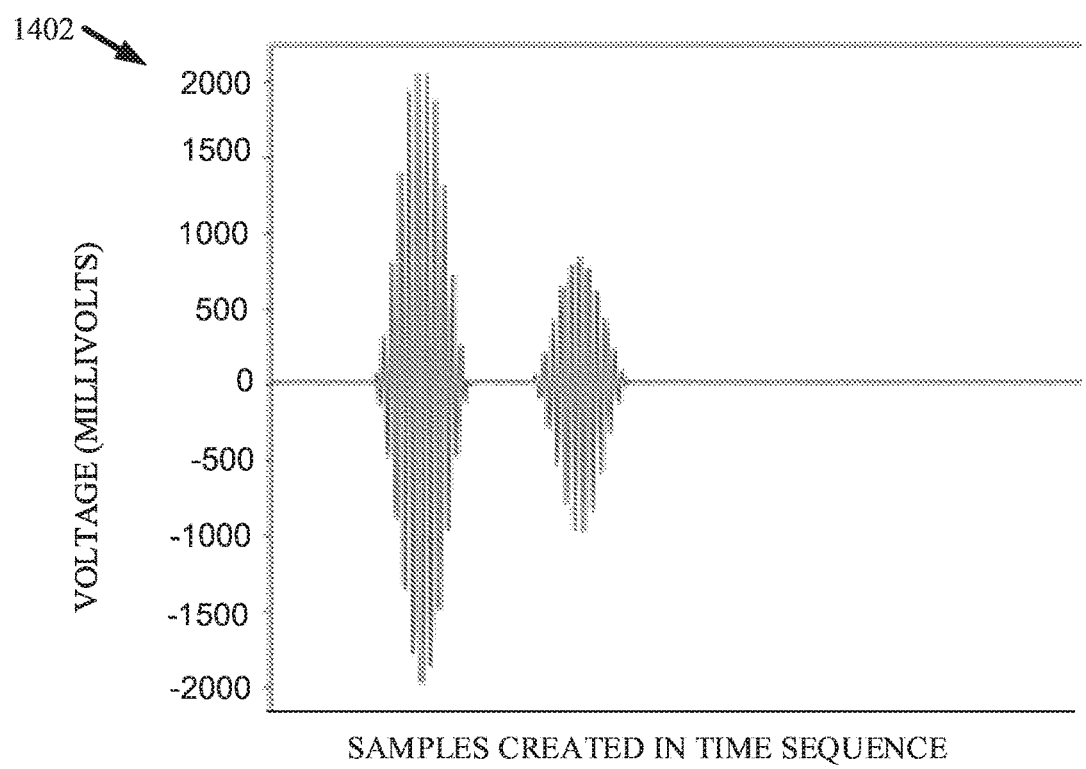

Graph 1200 of FIG. 12 can characterize an acquired signal 207 that can be found acceptable by the signal analysis component 110, wherein the acquired signal 207 can include a gaussian envelope modulated at a fixed frequency with a second gaussian envelope modulated at the same frequency, but with a different amplitude. In comparison, graph 1300 of FIG. 13 can characterize an acquired signal 207 that can be found to be unacceptable by the signal analysis component 110 due to an undesirable delay between the two pulses. For example, the distance between the two pulses of graph 1300 is markedly greater than the distance between the two pulses of graph 1200. Additionally, graph 1400 of FIG. 14 can characterize an acquired signal 207 that can be found to be unacceptable by the signal analysis component 110 due to an undesirable saturation of the second pulse (e.g., as compared to the second pulse shown in graph 1200). Moreover, graph 1402 of FIG. 14 can characterize an acquired signal 207 that can be found to be unacceptable by the signal analysis component 110 due to an undesirable decrease in the second pulse (e.g., as compared to the second pulse shown in graph 1200).

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 15:
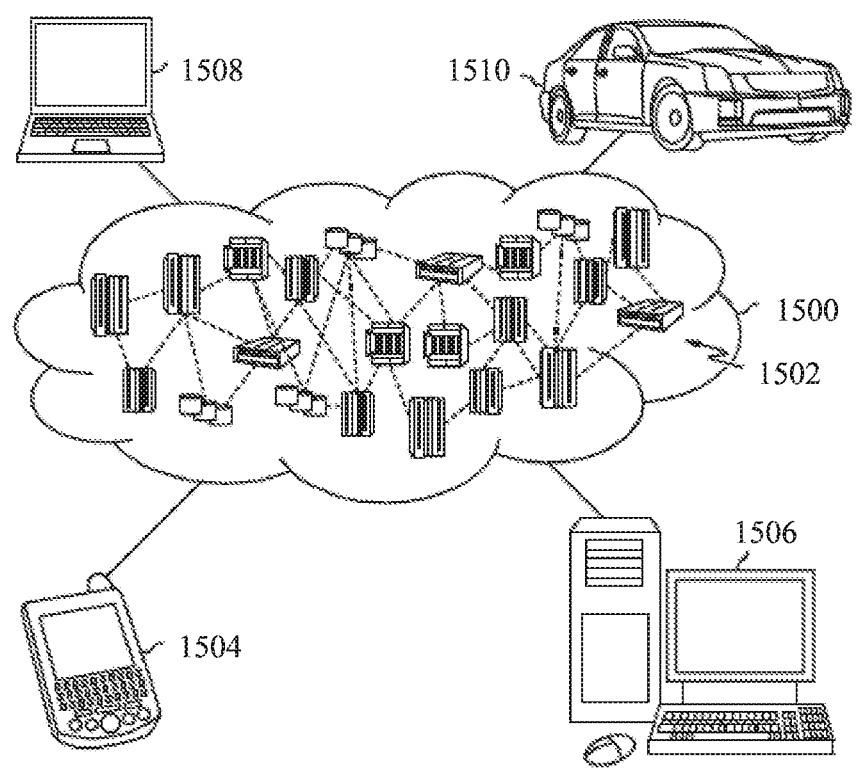
FIG. 15 depicts a cloud computing environment in accordance with one or more embodiments described herein.

Referring now to FIG. 15, illustrative cloud computing environment 1500 is depicted. As shown, cloud computing environment 1500 includes one or more cloud computing nodes 1502 with which local computing devices used by cloud consumers, such as, for example, personal digital assistant (PDA) or cellular telephone 1504, desktop computer 1506, laptop computer 1508, and/or automobile computer system 1510 may communicate. Nodes 1502 may communicate with one another. They may be grouped (not shown) physically or virtually, in one or more networks, such as Private, Community, Public, or Hybrid clouds as described hereinabove, or a combination thereof. This allows cloud computing environment 1500 to offer infrastructure, platforms and/or software as services for which a cloud consumer does not need to maintain resources on a local computing device. It is understood that the types of computing devices 1504-1510 shown in FIG. 15 are intended to be illustrative only and that computing nodes 1502 and cloud computing environment 1500 can communicate with any type of computerized device over any type of network and/or network addressable connection (e.g., using a web browser).

Figure 16:
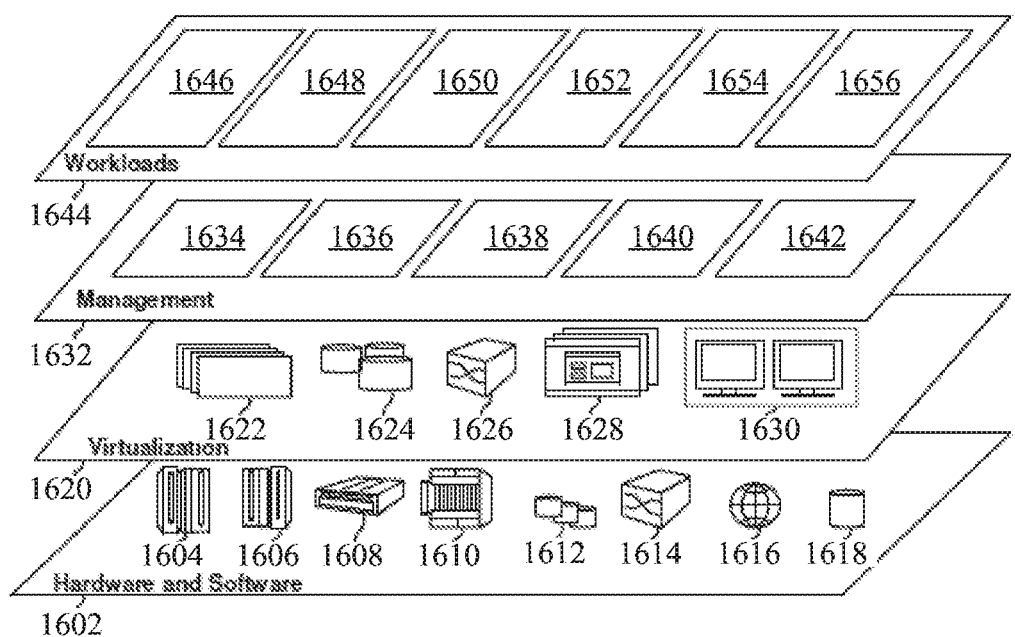
FIG. 16 depicts abstraction model layers in accordance with one or more embodiments described herein

Referring now to FIG. 16, a set of functional abstraction layers provided by cloud computing environment 1500 (FIG. 15) is shown. Repetitive description of like elements employed in other embodiments described herein is omitted for sake of brevity. It should be understood in advance that the components, layers, and functions shown in FIG. 16 are intended to be illustrative only and embodiments of the invention are not limited thereto. As depicted, the following layers and corresponding functions are provided.

Hardware and software layer 1602 includes hardware and software components. Examples of hardware components include: mainframes 1604; RISC (Reduced Instruction Set Computer) architecture based servers 1606; servers 1608; blade servers 1610; storage devices 1612; and networks and networking components 1614. In some embodiments, software components include network application server software 1616 and database software 1618.

Virtualization layer 1620 provides an abstraction layer from which the following examples of virtual entities may be provided: virtual servers 1622; virtual storage 1624; virtual networks 1626, including virtual private networks; virtual applications and operating systems 1628; and virtual clients 1630.

In one example, management layer 1632 may provide the functions described below. Resource provisioning 1634 provides dynamic procurement of computing resources and other resources that are utilized to perform tasks within the cloud computing environment. Metering and Pricing 1636 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1638 provides access to the cloud computing environment for consumers and system administrators. Service level management 1640 provides cloud computing resource allocation and management such that required service levels are met. Service Level Agreement (SLA) planning and fulfillment 1642 provide pre-arrangement for, and procurement of, cloud computing resources for which a future requirement is anticipated in accordance with an SLA.

Workloads layer 1644 provides examples of functionality for which the cloud computing environment may be utilized. Examples of workloads and functions which may be provided from this layer include: mapping and navigation 1646; software development and lifecycle management 1648; virtual classroom education delivery 1650; data analytics processing 1652; transaction processing 1654; and signal error detection 1656. Various embodiments of the present invention can utilize the cloud computing environment described with reference to FIGS. 15 and 16 to analyze one or more generated electrical signals to detect for errors associated with spurious data, time instability, phase slips, and/or the like.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 17:
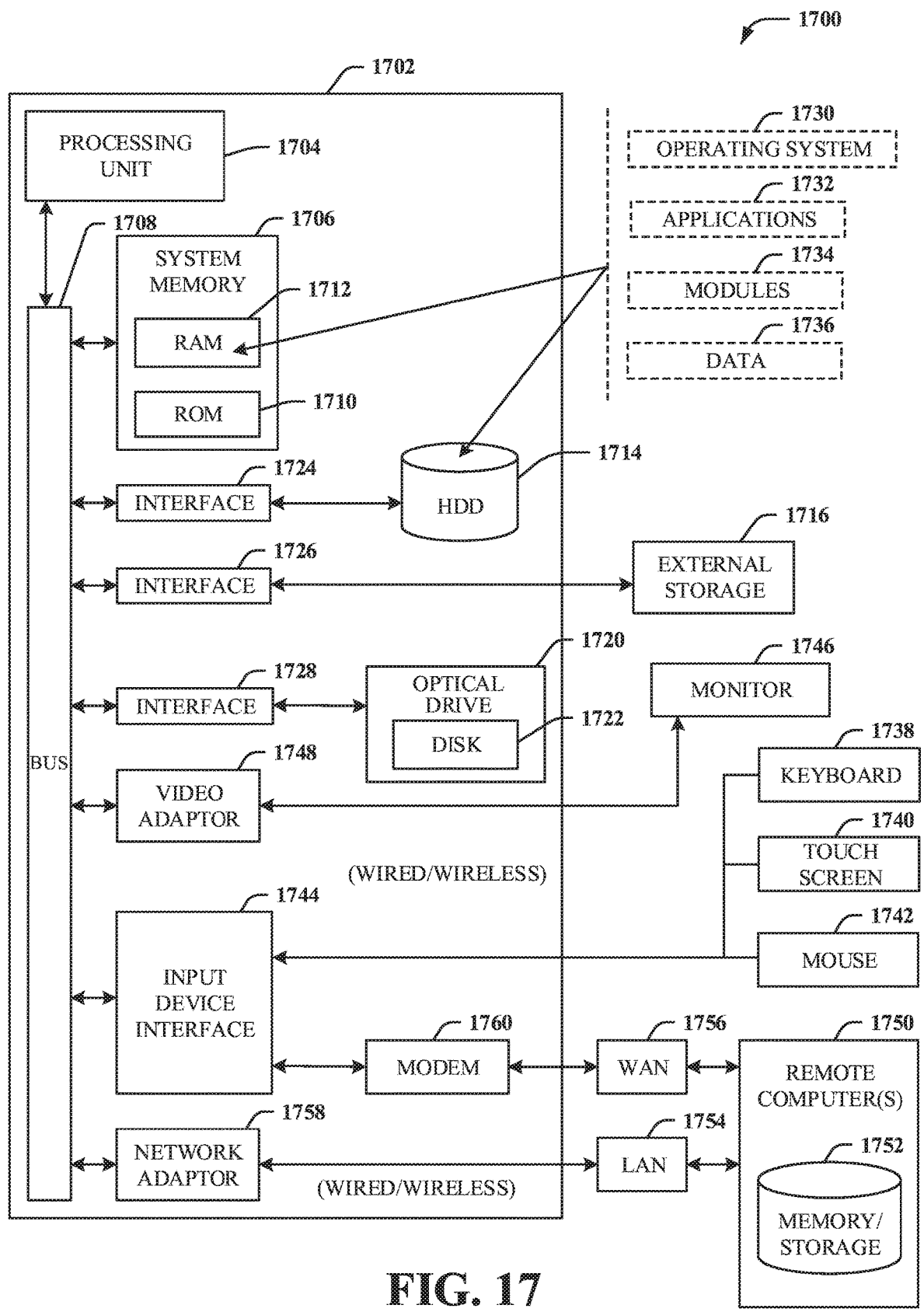
FIG. 17 illustrates a block diagram of an example, non-limiting operating environment in which one or more embodiments described herein can be facilitated.

In order to provide additional context for various embodiments described herein, FIG. 17 and the following discussion are intended to provide a general description of a suitable computing environment 1700 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things ("IoT") devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory ("RAM"), read only memory ("ROM"), electrically erasable programmable read only memory ("EEPROM"), flash memory or other memory technology, compact disk read only memory ("CD-ROM"), digital versatile disk ("DVD"), Blu-ray disc ("BD") or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 17, the example environment 1700 for implementing various embodiments of the aspects described herein includes a computer 1702, the computer 1702 including a processing unit 1704, a system memory 1706 and a system bus 1708. The system bus 1708 couples system components including, but not limited to, the system memory 1706 to the processing unit 1704. The processing unit 1704 can be any of various commercially available processors. Dual microprocessors and other multi-processor architectures can also be employed as the processing unit 1704.

The system bus 1708 can be any of several types of bus structure that can further interconnect to a memory bus (with or without a memory controller), a peripheral bus, and a local bus using any of a variety of commercially available bus architectures. The system memory 1706 includes ROM 1710 and RAM 1712. A basic input/output system ("BIOS") can be stored in a non-volatile memory such as ROM, erasable programmable read only memory ("EPROM"), EEPROM, which BIOS contains the basic routines that help to transfer information between elements within the computer 1702, such as during startup. The RAM 1712 can also include a high-speed RAM such as static RAM for caching data.

The computer 1702 further includes an internal hard disk drive ("HDD") 1714 (e.g., EIDE, SATA), one or more external storage devices 1716 (e.g., a magnetic floppy disk drive ("FDD") 1716, a memory stick or flash drive reader, a memory card reader, etc.) and an optical disk drive 1720 (e.g., which can read or write from a CD-ROM disc, a DVD, a BD, etc.). While the internal HDD 1714 is illustrated as located within the computer 1702, the internal HDD 1714 can also be configured for external use in a suitable chassis (not shown). Additionally, while not shown in environment 1700, a solid state drive ("SSD") could be used in addition to, or in place of, an HDD 1714. The HDD 1714, external storage device(s) 1716 and optical disk drive 1720 can be connected to the system bus 1708 by an HDD interface 1724, an external storage interface 1726 and an optical drive interface 1728, respectively. The interface 1724 for external drive implementations can include at least one or both of Universal Serial Bus ("USB") and Institute of Electrical and Electronics Engineers ("IEEE") 1394 interface technologies. Other external drive connection technologies are within contemplation of the embodiments described herein.

The drives and their associated computer-readable storage media provide nonvolatile storage of data, data structures, computer-executable instructions, and so forth. For the computer 1702, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1712, including an operating system 1730, one or more application programs 1732, other program modules 1734 and program data 1736. All or portions of the operating system, applications, modules, and/or data can also be cached in the RAM 1712. The systems and methods described herein can be implemented utilizing various commercially available operating systems or combinations of operating systems.

Computer 1702 can optionally comprise emulation technologies. For example, a hypervisor (not shown) or other intermediary can emulate a hardware environment for operating system 1730, and the emulated hardware can optionally be different from the hardware illustrated in FIG. 17. In such an embodiment, operating system 1730 can comprise one virtual machine ("VM") of multiple VMs hosted at computer 1702. Furthermore, operating system 1730 can provide runtime environments, such as the Java runtime environment or the .NET framework, for applications 1732. Runtime environments are consistent execution environments that allow applications 1732 to run on any operating system that includes the runtime environment. Similarly, operating system 1730 can support containers, and applications 1732 can be in the form of containers, which are lightweight, standalone, executable packages of software that include, e.g., code, runtime, system tools, system libraries and settings for an application.

Further, computer 1702 can be enable with a security module, such as a trusted processing module ("TPM"). For instance with a TPM, boot components hash next in time boot components, and wait for a match of results to secured values, before loading a next boot component. This process can take place at any layer in the code execution stack of computer 1702, e.g., applied at the application execution level or at the operating system ("OS") kernel level, thereby enabling security at any level of code execution.

A user can enter commands and information into the computer 1702 through one or more wired/wireless input devices, e.g., a keyboard 1738, a touch screen 1740, and a pointing device, such as a mouse 1742. Other input devices (not shown) can include a microphone, an infrared ("IR") remote control, a radio frequency ("RF") remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1704 through an input device interface 1744 that can be coupled to the system bus 1708, but can be connected by other interfaces, such as a parallel port, an IEEE 1394 serial port, a game port, a USB port, an IR interface, a BLUETOOTH® interface, etc.

A monitor 1746 or other type of display device can be also connected to the system bus 1708 via an interface, such as a video adapter 1748. In addition to the monitor 1746, a computer typically includes other peripheral output devices (not shown), such as speakers, printers, etc.

The computer 1702 can operate in a networked environment using logical connections via wired and/or wireless communications to one or more remote computers, such as a remote computer(s) 1750. The remote computer(s) 1750 can be a workstation, a server computer, a router, a personal computer, portable computer, microprocessor-based entertainment appliance, a peer device or other common network node, and typically includes many or all of the elements described relative to the computer 1702, although, for purposes of brevity, only a memory/storage device 1752 is illustrated. The logical connections depicted include wired/wireless connectivity to a local area network ("LAN") 1754 and/or larger networks, e.g., a wide area network ("WAN")

1756. Such LAN and WAN networking environments are commonplace in offices and companies, and facilitate enterprise-wide computer networks, such as intranets, all of which can connect to a global communications network, e.g., the Internet.

When used in a LAN networking environment, the computer 1702 can be connected to the local network 1754 through a wired and/or wireless communication network interface or adapter 1758. The adapter 1758 can facilitate wired or wireless communication to the LAN 1754, which can also include a wireless access point ("AP") disposed thereon for communicating with the adapter 1758 in a wireless mode.

When used in a WAN networking environment, the computer 1702 can include a modem 1760 or can be connected to a communications server on the WAN 1756 via other means for establishing communications over the WAN 1756, such as by way of the Internet. The modem 1760, which can be internal or external and a wired or wireless device, can be connected to the system bus 1708 via the input device interface 1744. In a networked environment, program modules depicted relative to the computer 1702 or portions thereof, can be stored in the remote memory/storage device 1752. It will be appreciated that the network connections shown are example and other means of establishing a communications link between the computers can be used.

When used in either a LAN or WAN networking environment, the computer 1702 can access cloud storage systems or other network-based storage systems in addition to, or in place of, external storage devices 1716 as described above. Generally, a connection between the computer 1702 and a cloud storage system can be established over a LAN 1754 or WAN 1756 e.g., by the adapter 1758 or modem 1760, respectively. Upon connecting the computer 1702 to an associated cloud storage system, the external storage interface 1726 can, with the aid of the adapter 1758 and/or modem 1760, manage storage provided by the cloud storage system as it would other types of external storage. For instance, the external storage interface 1726 can be configured to provide access to cloud storage sources as if those sources were physically connected to the computer 1702.

The computer 1702 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity ("Wi-Fi") and BLUETOOTH® wireless technologies. Thus, the communication can be a predefined structure as with a conventional network or simply an ad hoc communication between at least two devices.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor, operably coupled to the memory, and that executes the computer executable components stored in the memory, wherein the computer executable components comprise:
   a signal analysis component that determines a signal-to-noise ratio associated with a generated signal, wherein the signal-to-noise ratio incorporates a signal value based on a reference signal and a noise value based on a difference between the reference signal and an acquired signal.

2. The system of claim 1, further comprising:
   a quantum computer that includes:
   a digital-to-analog converter that provides the generated signal based on the reference signal;
   an analog-to-digital converter that generates the acquired signal based on the generated signal; and
   a qubit that is controllable by the generated signal.

3. The system of claim 1, further comprising:
   a reference component that matches a sampling rate of the reference signal and a sampling rate of the acquired signal by altering a sampling rate of the reference signal or the sampling rate of the acquired signal.

4. The system of claim 3, further comprising:
   a correlation component that executes a cross-correlation algorithm to generate an overlay of the reference signal and the acquired signal in a time-domain.

5. The system of claim 4, further comprising:
   a sample size component that renders the reference signal and the acquired signal the same sample size based on the overlay.

6. The system of claim 5, further comprising:
   a normalization component that normalizes the reference signal to be within a defined range to generate a normalized reference signal, and normalizes the acquired signal to be within the defined range to generate a normalized acquired signal.

7. The system of claim 6, further comprising:
   a noise component that determines a noise signal based on a difference between the normalized reference signal and the normalized acquired signal.

8. The system of claim 7, further comprising:
   a signal power component that determines the signal value based on the normalized reference signal, and determines the noise value based on the noise signal.

9. The system of claim 8, further comprising:
   a test component that determines whether a second generated signal comprises an error by comparing the signal-to-noise ratio of the generated signal to a second signal-to-noise ratio of the second generated signal.

10. A computer-implemented method, comprising:
    determining, by a computer operatively coupled to a processor, a signal-to-noise ratio associated with a generated signal, wherein the signal-to-noise ratio incorporates a signal value based on a reference signal and a noise value based on a difference between the reference signal and an acquired signal.

11. The computer-implemented method of claim 10, further comprising:
matching, by the computer, a sampling rate of the reference signal and a sampling rate of the acquired signal by altering a sampling rate of the reference signal or the sampling rate of the acquired signal; and
executing, by the computer, a cross-correlation algorithm to generate an overlay of the reference signal and the acquired signal in a time-domain.

12. The computer-implemented method of claim 11, further comprising:
rendering, by the computer, the reference signal and the acquired signal the same sample size based on the overlay.

13. The computer-implemented method of claim 12, further comprising:
normalizing, by the computer, the reference signal to be within a defined range to generate a normalized reference signal; and
normalizing, by the computer, the acquired signal to be within the defined range to generate a normalized acquired signal.

14. The computer-implemented method of claim 13, further comprising:
determining, by the computer, a noise signal based on a difference between the normalized reference signal and the normalized acquired signal;
determining, by the computer, the signal value based on the normalized reference signal; and
determining, by the computer, the noise value based on the noise signal.

15. The computer-implemented method of claim 14, further comprising:
determining, by the computer, whether a second generated signal comprises an error by comparing the signal-to-noise ratio of the generated signal to a second signal-to-noise ratio of the second generated signal.

16. A computer program product for detecting errors in a generated signal, the computer program product comprising a non-transitory computer readable storage medium having program instructions embodied therewith, the program instructions executable by a processor to cause the processor to:
determine, by the processor, a signal-to-noise ratio associated with the generated signal, wherein the signal-to-noise ratio incorporates a signal value based on a reference signal and a noise value based on a difference between the reference signal and an acquired signal.

17. The computer program product of claim 16, wherein the program instructions further cause the processor to:
match, by the processor, a sampling rate of the reference signal and a sampling rate of the acquired signal by altering a sampling rate of the reference signal or the sampling rate of the acquired signal,
execute, by the processor, a cross-correlation algorithm to generate an overlay of the reference signal and the acquired signal in a time-domain; and
render, by the processor, the reference signal and the acquired signal the same sample size based on the overlay.

18. The computer program product of claim 17, wherein the program instructions further cause the processor to:
normalize, by the processor, the reference signal to be within a defined range to generate a normalized reference signal; and
normalize, by the processor, the acquired signal to be within the defined range to generate a normalized acquired signal.

19. The computer program product of claim 18, wherein the program instructions further cause the processor to:
determine, by the processor, a noise signal based on a difference between the normalized reference signal and the normalized acquired signal;
determine, by the processor, the signal value based on the normalized reference signal; and
determine, by the processor, the noise value based on the noise signal.

20. The computer program product of claim 18, wherein the program instructions further cause the processor to:
determine, by the processor, whether a second generated signal comprises an error by comparing the signal-to-noise ratio of the qubit control signal to a second signal-to-noise ratio of the second generated signal.

* * * * *